(12) United States Patent
Kitayama et al.

(10) Patent No.: US 8,791,413 B2
(45) Date of Patent: Jul. 29, 2014

(54) CHARGED PARTICLE BEAM DEVICE AND SAMPLE OBSERVATION METHOD USING A ROTATING DETECTOR

(75) Inventors: Shinya Kitayama, Hitachinaka (JP); Wataru Suzuki, Hitachinaka (JP); Satoshi Tomimatsu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/817,644

(22) PCT Filed: Aug. 2, 2011

(86) PCT No.: PCT/JP2011/067638
§ 371 (c)(1),
(2), (4) Date: Feb. 19, 2013

(87) PCT Pub. No.: WO2012/026291
PCT Pub. Date: Mar. 1, 2012

(65) Prior Publication Data
US 2013/0146765 A1 Jun. 13, 2013

(30) Foreign Application Priority Data
Aug. 24, 2010 (JP) .................................. 2010-186734

(51) Int. Cl.
*G01N 23/00* (2006.01)
(52) U.S. Cl.
USPC ....................................... 250/306; 250/492.1
(58) Field of Classification Search
USPC ......... 250/306, 307, 311, 492.1, 492.2, 492.3
See application file for complete search history.

(56) References Cited

U.S. PATENT DOCUMENTS

| 5,051,585 A * | 9/1991 | Koshishiba et al. ............. 850/9 |
| 7,928,377 B2 * | 4/2011 | Ishitani et al. ................ 250/306 |

(Continued)

FOREIGN PATENT DOCUMENTS

| JP | 55-68059 A | 5/1980 |
| JP | 59-201356 A | 11/1984 |
| JP | 61-88442 A | 5/1986 |
| JP | 2002-150990 A | 5/2002 |
| JP | 2008-210702 A | 9/2008 |

OTHER PUBLICATIONS

International Search Report including English translation dated Sep. 27, 2011 (Four (4) pages).

*Primary Examiner* — Michael Logie
*Assistant Examiner* — Jason McCormack
(74) *Attorney, Agent, or Firm* — Crowell & Moring LLP

(57) ABSTRACT

Provided is a charged particle beam device that outputs both an ion beam and an electron beam at a sample, has a common detector for both the ion beam and the electron beam in the charged particle beam device that processes and observes the sample, and is able to provide a detection unit to an appropriate position corresponding to the process details and observation technique of the sample. Provided are an electron beam optical column in which an electron beam for observing the observation surface of a sample is generated, an ion beam optical column in which an ion beam that processes the sample is generated, a detection device that detects a secondary signal generated from the sample or transmitted electrons, and a sample stage that is capable of mounting the detection device thereon; is rotatable in a horizontal plane that includes the optical axis of the electron beam and the optical axis of the ion beam about a cross point where both optical axes intersect; and is able to change the distance between the observation surface of the sample and the cross point.

9 Claims, 24 Drawing Sheets

(56) References Cited

U.S. PATENT DOCUMENTS

| | | |
|---|---|---|
| 8,481,980 B2* | 7/2013 | Shichi et al. .............. 250/492.21 |
| 2007/0023654 A1* | 2/2007 | Kamimura et al. ........... 250/310 |
| 2007/0045560 A1* | 3/2007 | Takahashi et al. ....... 250/442.11 |
| 2008/0067385 A1* | 3/2008 | Tokuda et al. ................ 250/310 |
| 2008/0191151 A1* | 8/2008 | Shichi et al. ............... 250/492.3 |
| 2008/0258056 A1* | 10/2008 | Zaykova-Feldman et al. .............. 250/307 |
| 2008/0296498 A1* | 12/2008 | Hong ........................... 250/311 |
| 2010/0025580 A1* | 2/2010 | Hammer et al. .............. 250/311 |

* cited by examiner

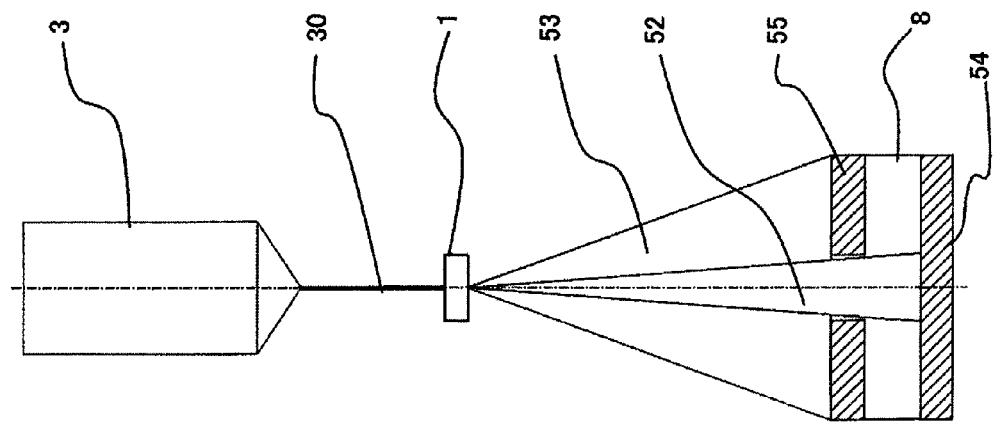
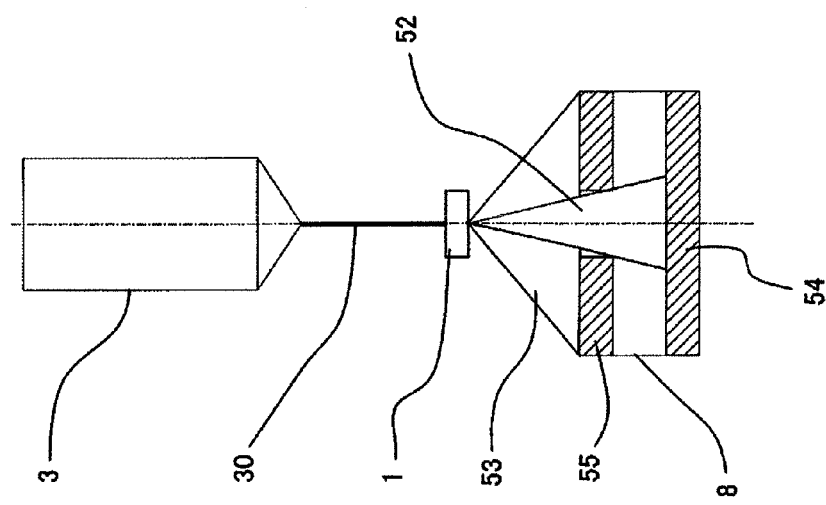

CHARGED PARTICLE BEAM DEVICE AND SAMPLE OBSERVATION METHOD USING A ROTATING DETECTOR

TECHNICAL FIELD

The present invention relates to a charged particle beam device used as a means for observing, analyzing, and evaluating an object to be observed and to a method for observing a sample using a charged particle beam.

BACKGROUND ART

Miniaturization of semiconductor devices of recent years is making progresses, and scanning electron microscopes (hereinafter abbreviated to SEMs), scanning transmission electron microscopes (hereinafter abbreviated to STEMs), transmission electron microscopes (hereinafter abbreviated to TEMs), and so on are used for analyses of defective portions in manufacturing steps. In order to observe a sample using a STEM or a TEM from among these, it is necessary that a portion of an object to be analyzed be cut out from a sample such as a semiconductor wafer or a semiconductor chip and be machined so thin that an electron beam can penetrate. A focused ion beam (hereinafter abbreviated to FIB) apparatus is used in this application. With the FIB a situation of machining can be observed by detecting and imaging a secondary signal such as secondary electrons generated from the sample by irradiating the sample with an ion beam; however, since the resolution is low and it is impossible to cope with recent miniaturization of subject samples, an apparatus equipped with both of an FIB column and an SEM column for a single sample chamber has been developed. This apparatus is hereinafter referred to as an FIB-SEM. Furthermore, in order to observe a sample of a thin leaf machined by an FIB apparatus using an STEM, an apparatus equipped with both of an FIB column and an STEM column has been developed. This apparatus is hereinafter referred to as an FIB-STEM.

In the above-described FIB-SEM and FIB-STEM, because their respective columns occupy large volumes, it is impossible to make their optical axes coaxial with each other. Accordingly, contrivances are made to place the sample at a position and an orientation appropriate relative to the respective optical axes. For example, a high-resolution image can be obtained by rotating the sample such that the machined surface of the sample is placed perpendicular to the optical axis of the SEM (for example, see Patent Literature 1).

CITATION LIST

Patent Literature

Patent Literature 1: JP-A-2002-150990

SUMMARY OF INVENTION

Technical Problem

In an electron microscope in which a sample is irradiated with a finely focused charged particle beam such as an electron beam and a secondary signal such as secondary electrons or transmitted electrons is detected with a detector, the amount of the secondary signal detected by the detector varies when the sample is tilted. Namely, there is an optimum position between the sample and the detector for acquiring intended information. For example, when an image of the bottom of a hole formed in a sample is acquired, where the position of the detector is fixed and only the sample is tilted, the direction of secondary electrons released from the bottom of the hole deviates from the direction of the detector because the side face of the hole in the sample is tilted at the same time. Furthermore, since in the case of an FIB-SEM or an FIB-STEM, machining of the sample and image formation are done at a cross point where the ion beam and the electron beam intersect with each other, the optical axis of the ion beam makes an angle to the optical axis of the electron beam; therefore, the position of the detector for acquiring an image when an ion beam is casted is not the same as the position of the detector for acquiring an image when an electron beam is casted and it is necessary that the detectors be installed at their respective optimum positions.

The present invention has an objective to provide a charged particle beam device performing machining and observation of a sample by irradiating the sample with both an ion beam and an electron beam in which a common detector is provided for both the ion beam and the electron beam and the detector can be installed at a position suitable according to the contents of machining of the sample and the observation methods.

Solution to Problem

To achieve the foregoing objective, an embodiment of the present invention is characterized by having: an electron beam optics column which generates an electron beam for observing an observed surface of a sample; an ion beam optics column which generates an ion beam to machine the sample; a detector which detects a secondary signal or transmitted electrons generated from the sample; and a sample stage on which the detector is mounted, which is capable of rotating with a cross point at which the optical axis of the electron beam and the optical axis of the ion beam intersect as a center and within a plane including both of the optical axes, and which is capable of varying a distance between the observed surface of the sample and the cross point.

Furthermore, an embodiment of the present invention is characterized by having: an electron beam optics column which generates an electron beam for observing an observed surface of a sample; an ion beam optics column which generates an ion beam to machine the sample; a first sample stage on which a minute specimen cut out from the sample by machining using the ion beam is mounted; and a second sample stage on which the sample from which the minute specimen is not yet cut out and a detector to detect transmitted electrons from the sample are mounted and which is capable of horizontal movement, vertical movement, and tilt.

Advantageous Effects of Invention

According to the present invention, it is possible to provide a charged particle beam device having a detector common for both an ion beam and an electron beam and which can be installed at a position suitable according to the contents of machining of a sample and observation methods.

Other objects, features, and advantages of the present invention will become apparent from the following description of the embodiments of the invention taken in conjunction with the accompanying drawings.

BRIEF DESCRIPTION OF DRAWINGS

FIG. 11A is a side view where the portion of the electron beam optics system of FIG. 10 is extracted;

FIG. 11B is a side view where the portion of the electron beam optics system of FIG. 10 is extracted;

DESCRIPTION OF EMBODIMENTS

Embodiments of the present invention are hereinafter described with reference to the drawings.

Embodiment 1

Figure 1:
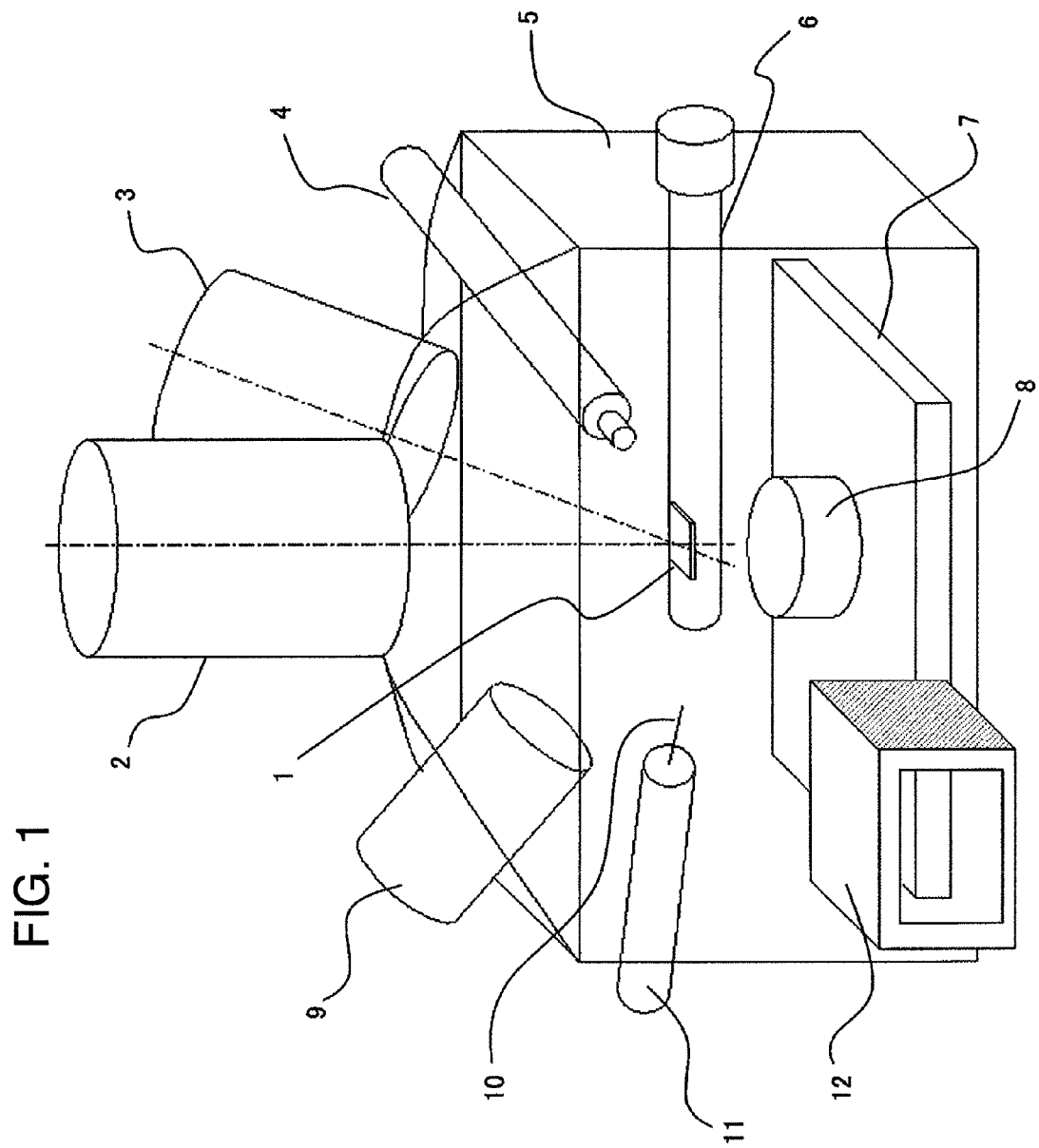
FIG. 1 is a perspective view showing the internal structure of an FIB-STEM device.

A first embodiment is described. FIG. 1 is a perspective view showing the internal structure of an FIB-STEM device. It has a structure in which a column for irradiating a sample with an ion beam, a column for irradiating it with an electron beam, a detector for detecting secondary electrons generated at the sample, and a detector for detecting transmitted electrons transmitted through the sample are provided.

In FIG. 1, it has an ion beam optics system 2 for irradiating a sample 1 with an ion beam, an electron beam optics system 3 for irradiating the sample 1 with an electron beam, a first sample stage 6 having a sample holder on which the sample 1 is mounted, a second sample stage 7 on which the sample 1 and detectors can be mounted, a first detector 9 for detecting secondary electrons or the like emitted from the sample 1 by irradiation of the ion beam or the electron beam, a second detector 8 attachable/detachable to the second sample stage 7, a probe driving mechanism 11 for driving a probe 10 used when the sample 1 is taken out after being machined, a deposition gas source 4 for supplying a gas for ion-beam-assisted deposition, a transport mechanism 12 for transporting the sample 1, the second detector 8, or the like into a sample chamber 5 of the device, and a central control-and-display unit, which is not shown, for controlling these instruments.

The first sample stage 6 contains a not-shown sample holder on which the sample 1 is mounted. The sample holder has an area on which the sample 1 is directly mounted or a mesh area in which a mesh is arranged, on which the sample 1 of a thin piece is mounted. The sample holder may have both an area on which the sample 1 is directly mounted and a mesh area in which a mesh having the thin piece mounted thereon is arranged. Further, the first sample stage 6 is capable of planar movement, tilt movement, and rotation of the sample 1 so that it can cause a certain location of the sample 1 move into a position of ion beam irradiation or an observation position of the electron beam. Since the first sample stage 6 can move with high accuracy and is highly vibration-resistant, it is often used for observations of high accuracy.

The second sample stage 7 can have the sample 1 and the second detector 8 mounted thereon and is capable of planar movement and, tilt movement and movement in the height direction with the cross point of the ion beam and the electron beam as the center. Furthermore, the second detector 8 can be arranged in a prescribed position. The second sample stage 7 has the feature that a large sample such as a semiconductor wafer can be mounted thereon.

The second detector 8 can be attached to and detached from the second sample stage 7, and secondary electrons, secondary ions, backscattered electrons, X-rays, reflected electrons, transmitted electrons, or the like are objects to be detected, which are generated from the sample 1, the probe 10, or the like due to irradiation of an ion beam or an electron beam.

The central control-and-display unit can process signals from the first detector 9 and the second detector 8, image them, and display them on a not-illustrated display unit. Furthermore, it can control the ion beam optics system 2, the electron beam optics system 3, the first sample stage 6, the second sample stage 7, the first detector 9, the second detector 8, the probe driving mechanism 11, the deposition gas source 4, the transport mechanism 12, and so on, respectively.

Figure 4:
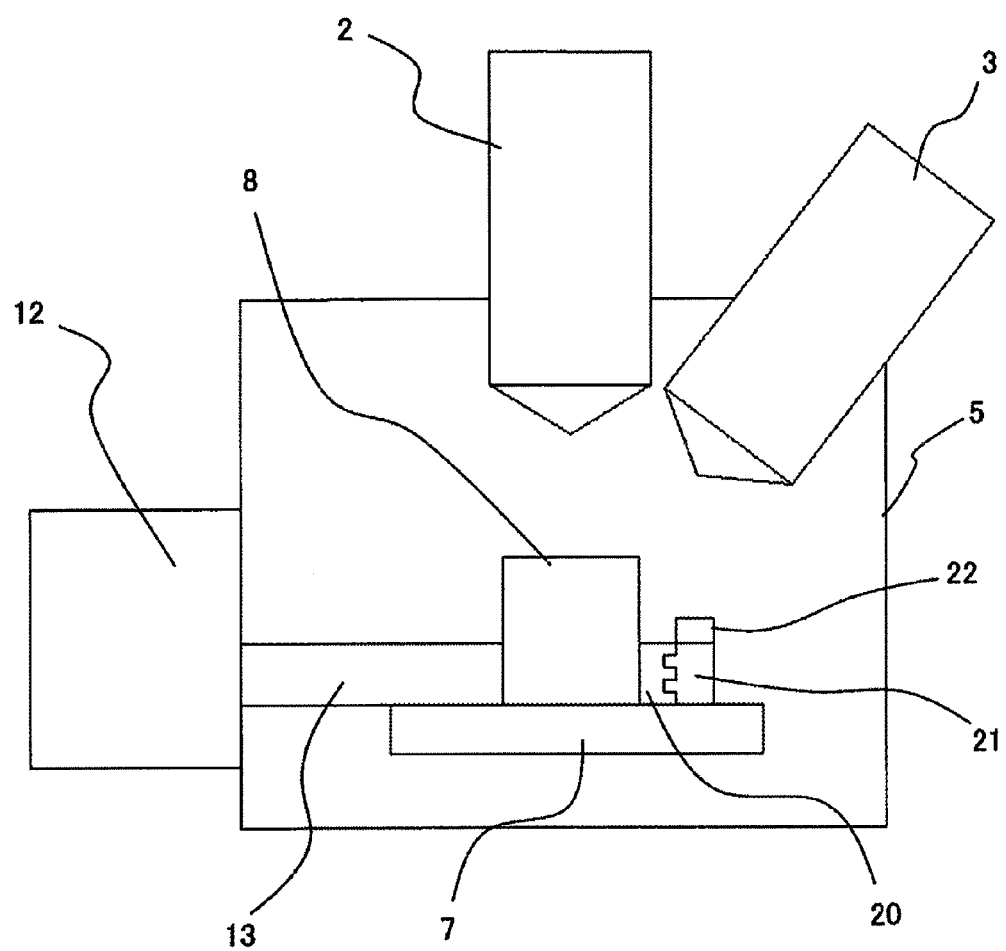
FIG. 4 is a longitudinal cross section showing a schematic of the internal structure of the FIB-STEM device viewed from a side.
Figure 5:
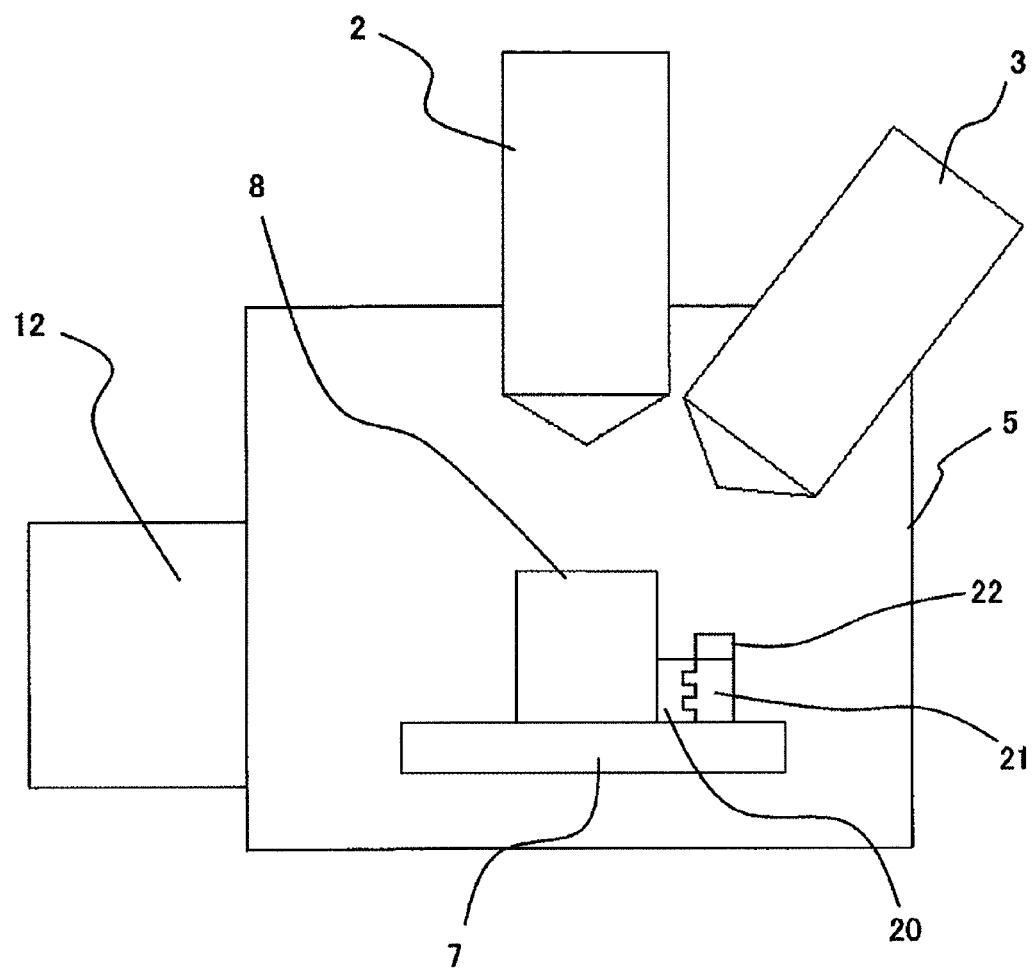
FIG. 5 is a longitudinal cross section showing a schematic of the internal structure of the FIB-STEM device viewed from a side.
Figure 6:
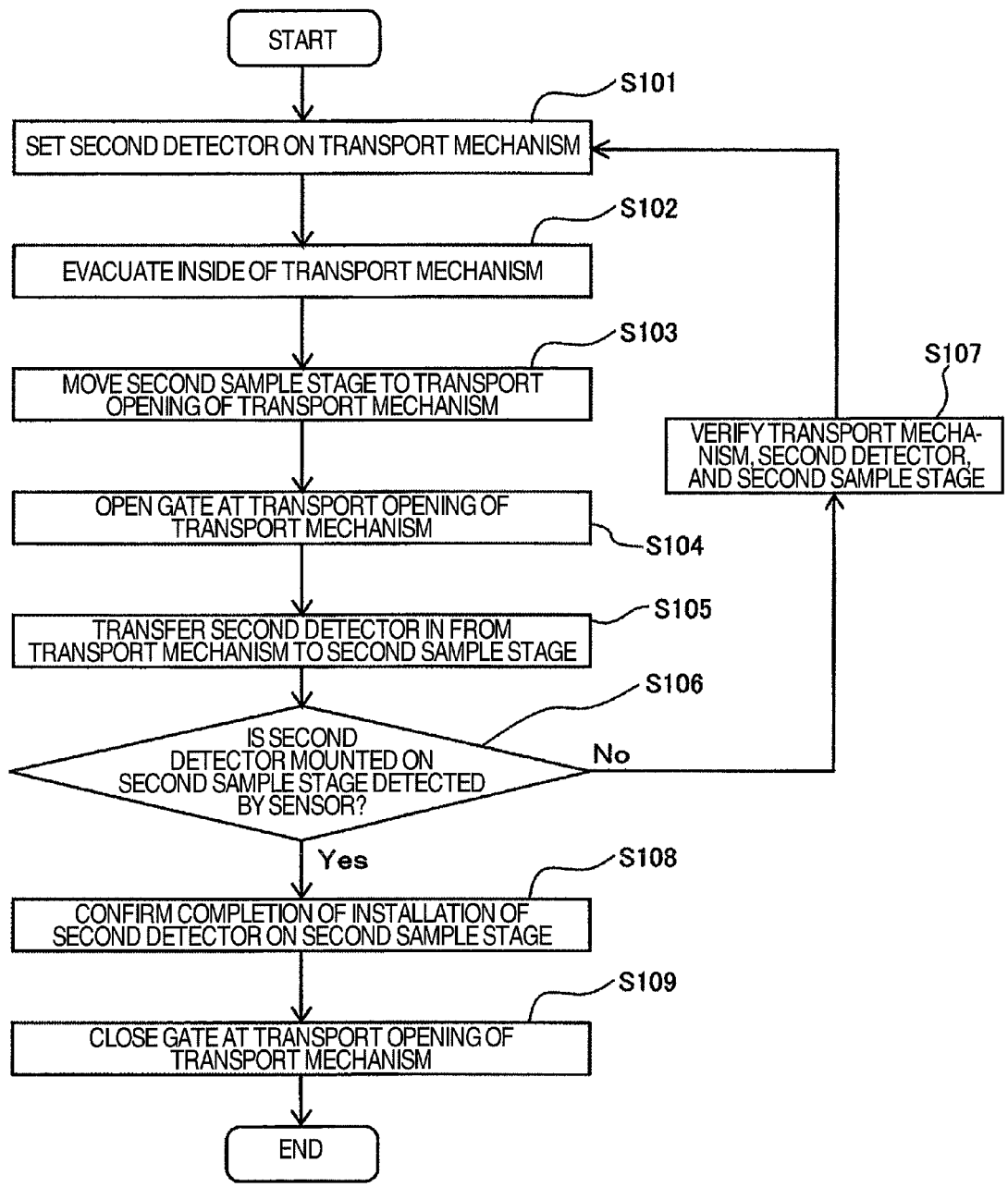
FIG. 6 is a flowchart illustrating a procedure of mounting a second detector on a second stage.

FIGS. 2-5 are longitudinal cross sections showing schematics of the internal structure of an FIB-STEM device viewed from a side. FIG. 6 is a flowchart illustrating a procedure of mounting the second detector 8 on the second stage 7.

Figure 2:
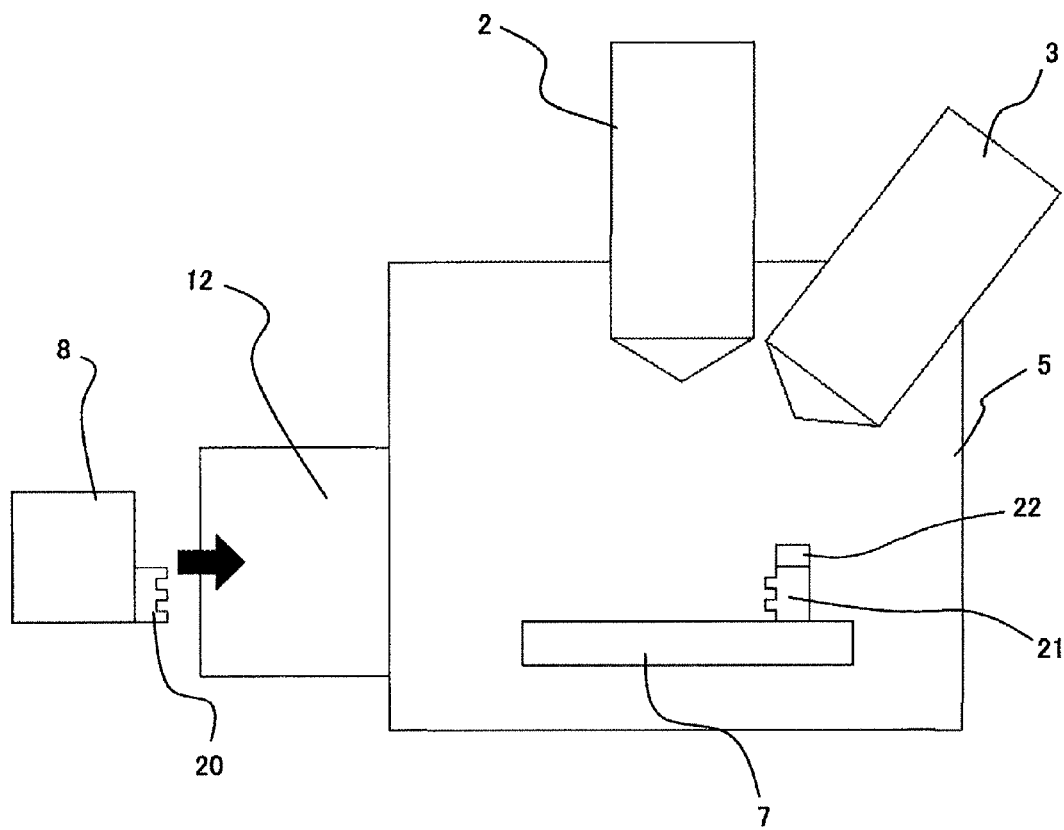
FIG. 2 is a longitudinal cross section showing a schematic of the internal structure of an FIB-STEM device viewed from a side.
Figure 3:
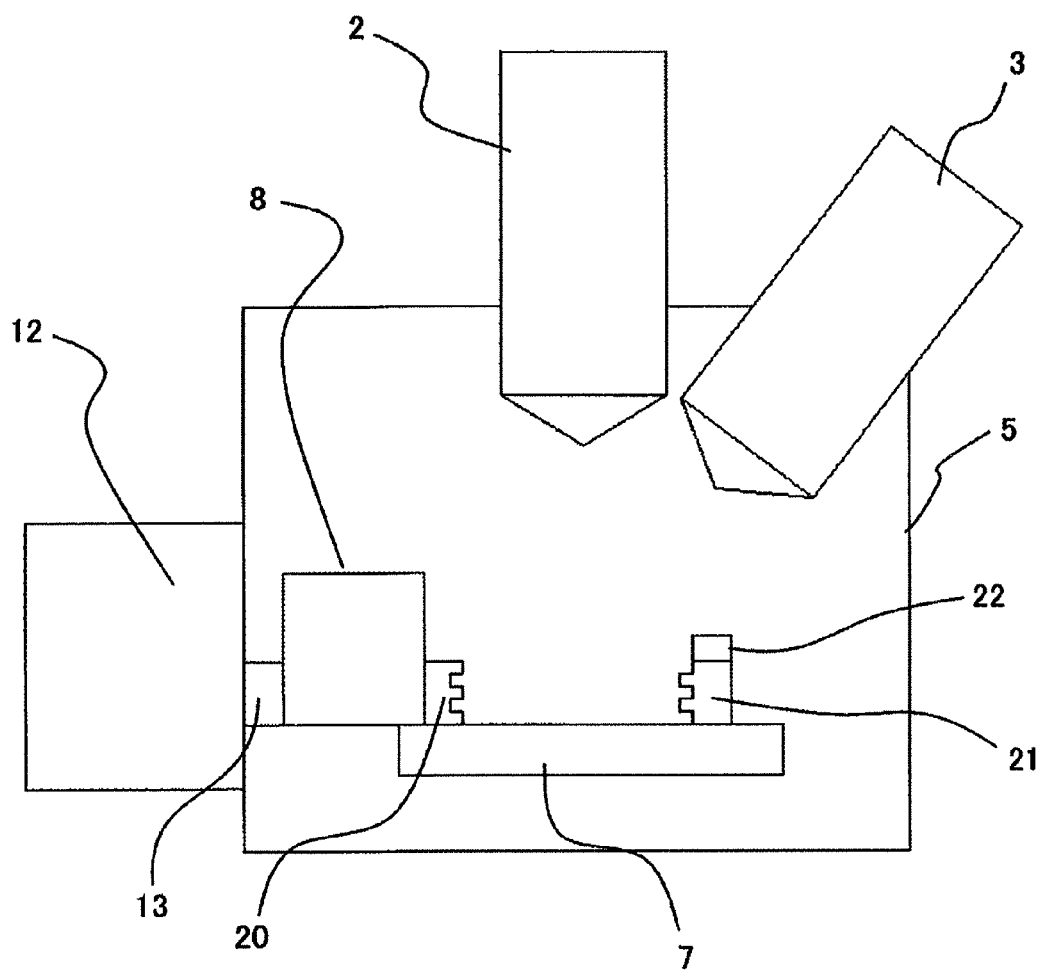
FIG. 3 is a longitudinal cross section showing a schematic of the internal structure of the FIB-STEM device viewed from a side.

The following procedure is carried out by a processor of the central control-and-display unit, which is not shown, executing a preset control program. In FIG. 2, in the state where a gate between the sample chamber 5 and the transport mechanism 12 is closed, a gate of the atmospheric side of the transport mechanism 12 is opened and the second detector 8 is introduced into the transport mechanism 12 (S101). Then, the gate of the atmospheric side of the transport mechanism 12 is closed and the inside of the transport mechanism 12 is evacuated to the same degree of vacuum as the inside of the sample chamber 5 (S102). Next, as shown in FIG. 3, the gate between the transport mechanism 12 and the sample chamber 5 is opened (S104) and the second detector 8 is introduced into the sample chamber 5 by a transport arm 13 of the transport mechanism 12 (S105). At this time, in order to make the moving distance of the transport arm 13 short, the second sample stage 7 may be brought close to the transport mechanism 12 (S103). And, as shown in FIG. 4, the transport arm 13 pushes a connector 20 into a plug part of a connector 21 provided on the second sample stage 7. When the second detector 8 is pushed in, the connector 20 provided to the second detector 8 and the connector 21 provided to the second sample stage 7 are connected together so that, the second detector 8 becomes ready to use as shown in FIG. 5.

Mounting the second detector 8 on the second sample stage 7 is detected by a sensor 22 (S106). Where the second detector 8 cannot be detected by the sensor 22, upon verifying whether the transport mechanism 12, the second detector 8, and the second sample stage 7 have no abnormalities (S107), it returns to S101 and the second detector 8 is again set to the transport mechanism 12. Where the second detector 8 can be detected by the sensor 22, the central control-and-display unit confirms the completion of setting of the second detector 8 to the second sample stage 7 (S108), the transport arm 13 detaches the second detector 8 from itself and moves back to the transport mechanism 12 as shown in FIG. 5, and the gate between the transport mechanism 12 and the sample chamber 5 is closed (S109). With this method, the second detector 8 can be introduced to the inside of the device without opening the sample chamber 5 to the atmosphere.

When the second detector 8 is taken out of the device, the reversed procedure is carried out. Also, this method can be implemented similarly in the case of a sample as well as in the case of the detector. When the sample 1 is mounted on the second sample stage 7, observation, machining, or the like of the sample 1 can be carried out using the first detector 9 fixed in the sample chamber 5 shown in FIG. 1. Incidentally, a procedure may also be gone through consisting of taking the second sample stage 7 per se out of the sample chamber 5 and returning it into the sample chamber 5 after attaching the sample 1 and the second detector 8 to the second sample stage 7. In this case, the transport mechanism 12 having a size permitting the second sample stage 7 to be taken in and out is prepared.

Figure 7:
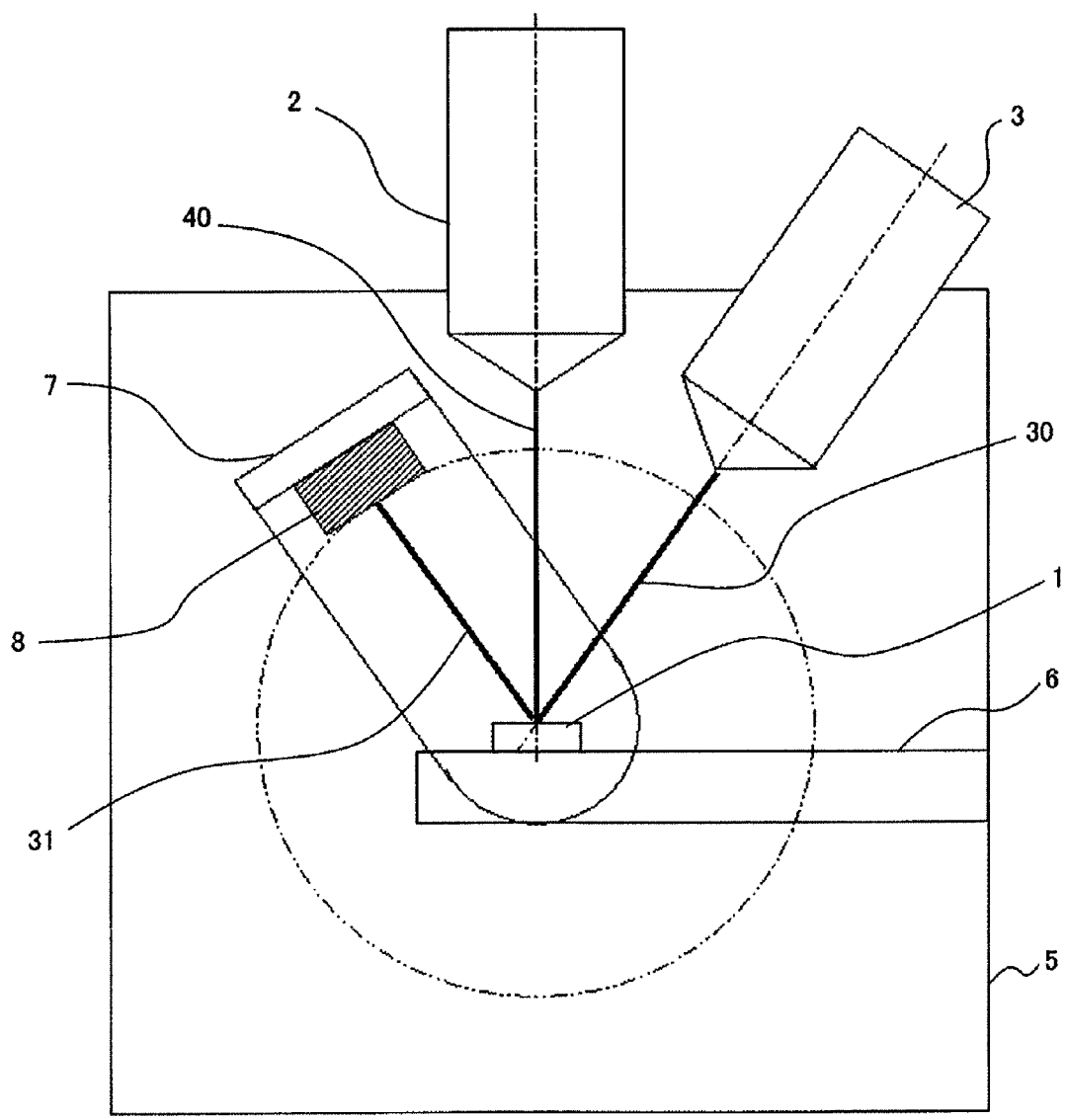
FIG. 7 is a longitudinal cross section showing a schematic of the internal structure of the FIB-STEM device viewed from a side.

FIGS. 7-10 are longitudinal cross sections showing schematics of the internal structure of the FIB-STEM device viewed from a side. FIG. 7 shows the position of the second sample stage 7 when an image acquired by the second detector 8 while irradiating with an electron beam 30 during machining of the sample 1 using an ion beam 40 is observed. The second detector 8 is so positioned that the optical axis of the electron beam optics system 3 and the principal axis 31 of the second detector 8 are in line symmetry with respect to the optical axis of the ion beam optics system 2. Assuming that the second sample stage 7 on which the second detector 8 is disposed can be rotated around the cross point at which the optical axis of the electron beam optics system 3 and the optical axis of the ion beam optics system 2 intersect with each other as the center and within a plane including both the optical axes, the sample 1 can be tilted to any arbitrary position. Furthermore, the distance between the observed surface of the sample 1 and the cross point can be varied. In this way, the tilt and the distance of the sample 1 can be adjusted and, therefore, the location where the second detector 8 is placed may be selected to be a location where a secondary signal such as reflected electrons released from the sample 1 is detected strong. In addition, an adjustment is made with the first sample stage 6 such that the observed surface of the sample 1 faces the direction of the ion beam optics system 2.

The electron beam 30 emitted from the electron beam optics system 3 impinges on the sample 1 and is scanned, and a secondary signal such as secondary electrons is detected by the second detector 8. Since observations can be made without directing the sample surface of the sample 1 toward the direction of the electron beam optics system 3 during machining with the ion beam 40, the throughput of machining with the ion beam 40 can be improved.

Figure 8:
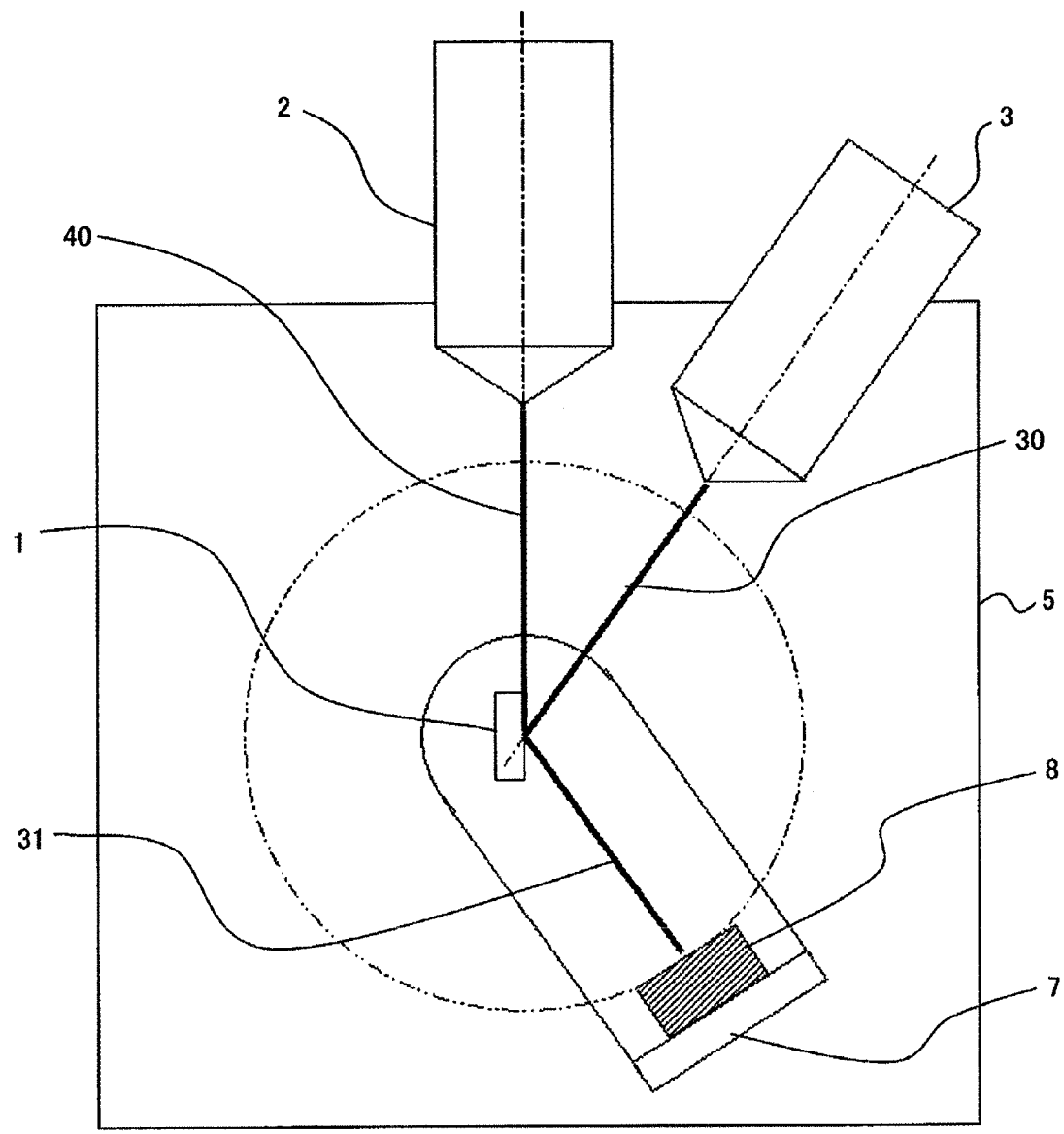
FIG. 8 is a longitudinal cross section showing a schematic of the internal structure of the FIB-STEM device viewed from a side.

FIG. 8 shows the arrangement of the second sample stage 7 when the sample 1 is machined into a thin film and the end point of the machining is detected. The position of the sample 1 is adjusted by the first sample stage 6 (not shown) so that the machined surface of the sample 1 becomes parallel to the optical axis of the ion beam optics system 2 and the sample 1 is scraped down to a thin film from right to left in the figure by the ion beam 40. The second sample stage 7 is rotated as indicated by the two-dot chain line with respect to the embodiment shown in FIG. 7 and the second detector 8 is arranged at a lower right of the figure, namely in such a way that the optical axis of the electron beam optics system 3 and the principal axis 31 of the second detector 8 are in line symmetry about the line normal to the machined surface of the sample 1. Since the second sample stage 7 on which the second detector 8 is disposed is adjustable in rotation within the plane of the paper of the figure and in a distance with respect to the sample 1, the arrangement location of the second detector 8 may be selected at a location where a secondary signal such as reflected electrons released from the sample 1 is detected strong.

The electron beam 30 emitted from the electron beam optics system 3 is made to impinge on the sample 1 and scanned, and a secondary signal is detected by the second detector 8. The observed surface of the sample 1 can be observed with the electron beam optics system 3 while the sample 1 is being made into a thin film by the ion beam 40 emitted from the ion beam optics system 2; detection of the end point of the machining with the ion beam 40 can be carried out with high accuracy.

Figure 9:
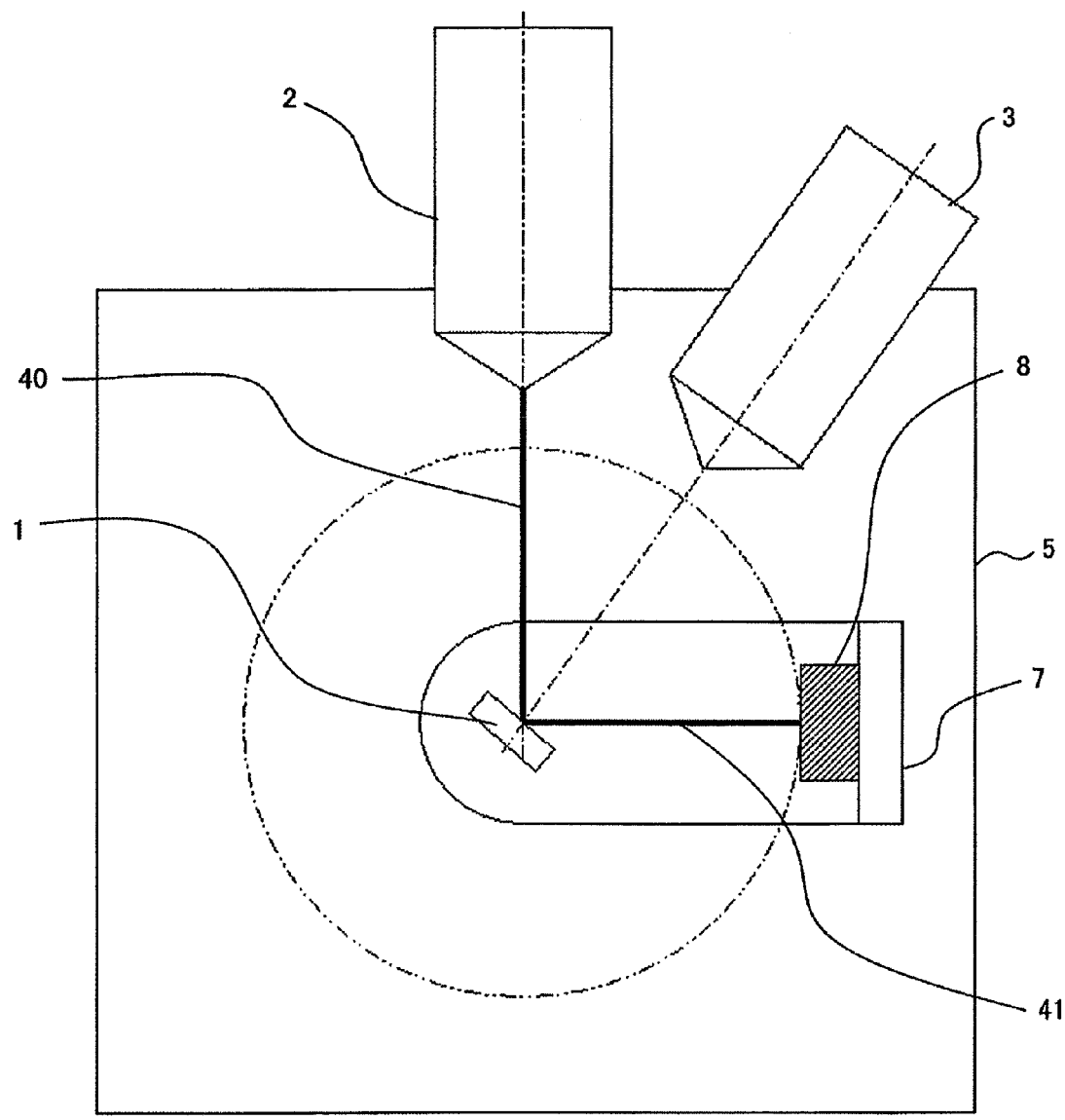
FIG. 9 is a longitudinal cross section showing a schematic of the internal structure of the FIB-STEM device viewed from a side.

FIG. 9 shows the arrangement of the second detector 8 in a case where a secondary signal generated from the sample 1 by irradiating the sample 1 with the ion beam 40 is detected so that the situation of the machining with the ion beam 40 is imaged and observed. Observation using the ion beam 40 is referred to as SIM (Scanning Ion Beam Microscope) observation. SIM observation is convenient because machining can be made to proceed while verifying the situation of machining of the sample 1; however, images with an ion beam are lower in resolution than images with an electron beam and applications using SIM observation are limited. The first sample stage 6 is adjusted so that the observed surface of the sample 1 faces the electron beam optics system 3 and it is arranged so that the optical axis of the ion beam optics system 2 and the principal axis 41 of the second detector 8 are in line symmetry about the line normal to the observed surface of the sample 1.

The ion beam 40 emitted from the ion beam optics system 2 is made to impinge on the sample 1 and scanned, and a secondary signal is detected by the second detector 8. This arrangement is suitable for SIM observation during machining of the sample with an ion beam. The second sample stage 7 on which the second detector 8 is disposed is adjustable in rotation within the plane of the paper of the figure and in the distance with respect to the sample 1.

Figure 10:
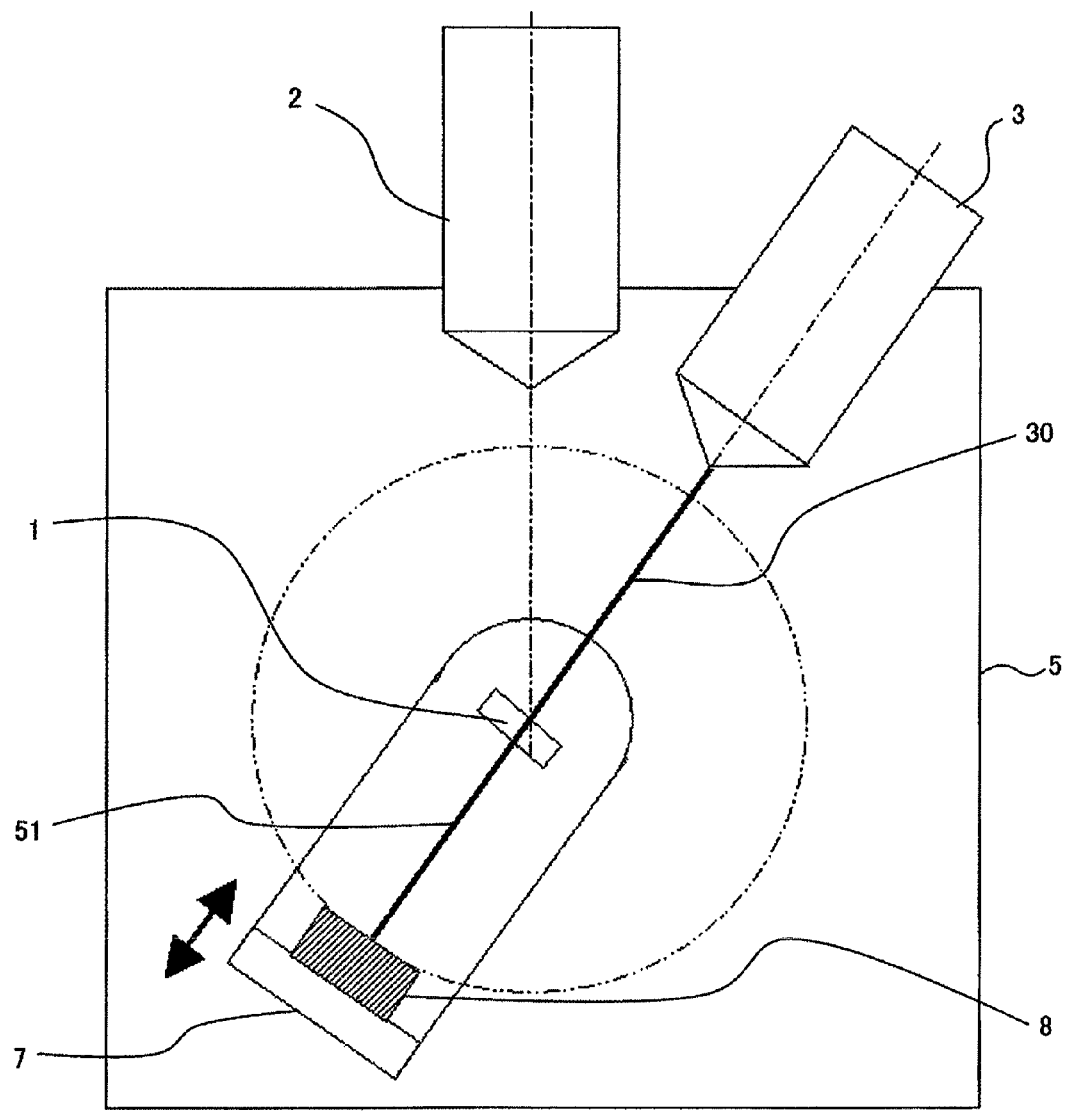
FIG. 10 is a longitudinal cross section showing a schematic of the internal structure of the FIB-STEM device viewed from a side.

FIG. 10 is a longitudinal cross section showing a schematic of the internal structure of the FIB-STEM device viewed from a side. The first sample stage 6 is so adjusted that the observed surface of the sample 1 faces the electron beam optics system 3, the second sample stage 7 is so adjusted that the second detector 8 faces the electron beam optics system 3, and the sample 1 and the second detector 8 are arranged on the optical axis of the electron beam 30 of the electron beam optics system 3. Transmitted electrons 51 transmitted through the sample 1 are detected by the second detector 8 so that STEM observation of the sample 1 can be performed. Because the second sample stage 7 on which the second detector 8 is disposed can adjust rotation within the plane of the plane of the figure and the distance with respect to the sample 1, the arrangement location of the second detector 8 may be selected at a location where transmitted electrons transmitted through the sample 1 are detected strong.

FIGS. 11A and 11B are side views where the portion of the electron beam optics system 3 of FIG. 10 is extracted. The electron beam 30 emitted from the electron beam optics system 3 is made to impinge on the sample 1 and scanned, and transmitted electrons are detected by the second detector 8. The transmitted electrons are classified into bright-field transmitted electrons 52 transmitted without being scattered or diffracted within the sample 1 and dark-field transmitted electrons 53 transmitted while undergoing scattering or diffraction within the sample 1. Within the second detector 8, the bright-field transmitted electrons 52 are detected by a bright-field detection portion 54 and the dark-field transmitted electrons 53 are detected by a dark-field detection portion 55. The distance between the second detector 8 and the sample 1 can be varied by moving the second sample stage 7 up and down. FIG. 11A shows a case where the distance between the second detector 8 and the sample 1 is short, and FIG. 11B shows a case where the distance between the second detector 8 and the sample 1 is long; it can be seen that the detection angle of scattered electrons of the dark-field transmitted electrons 53 changes when the distance between the sample 1 and the second detector 8 is varied. Z-contrast observation can be carried out by bringing the second detector 8 mounted on the second sample stage 7 closer to the sample 1 so as to increase the detection angle of the scattered electrons.

Figure 12:
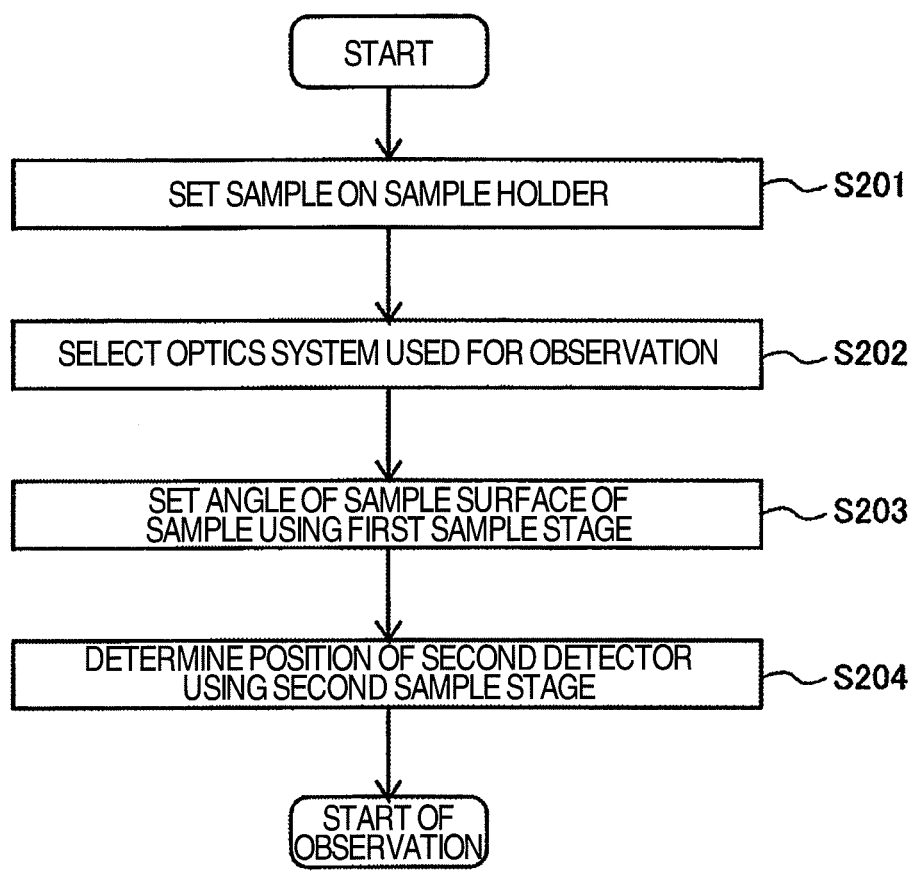
FIG. 12 is a flowchart of movement processing of the second detector.

FIG. 12 is a flowchart of movement processing of the second detector 8. The flow from setting the sample 1 on the first sample stage 6 to a start of an observation is explained. First, the sample 1 is set on the first sample stage 6 (S201). Then, an optics system used for the observation is selected (S202). Then, the angle of the observed surface of the sample 1 is set using the first sample stage 6 (S203). Then, the second detector 8 is moved into an optimum position using the second sample stage 7 based on the used optics system and information on the angle of the observed surface of the sample 1 (S204).

Since in the above-described Embodiment the position of the second detector 8 can be varied with the sample 1 as the center and the height can be varied, the optimum position for signal detection which is determined according to the attitude and the shape of the sample 1 can be adjusted and, further, detection of a desired signal such as secondary electrons, secondary ions, or transmitted electrons can be selectively acquired.

While the ion beam optics system 2 is arranged vertically and the electron beam optics system 3 is arranged obliquely in Embodiment 1 , the ion beam optics system 2 may be arranged obliquely and the electron beam optics system 3 may be arranged vertically. Moreover, both of the ion beam optics system 2 and the electron beam optics system 3 may be arranged obliquely. Additionally, a structure of a triple-beam optics system comprising a gallium ion beam optics system, a gas ion beam optics system, and an electron beam optics system system may be adopted.

Embodiment 2

A second embodiment is described.

Figure 13:
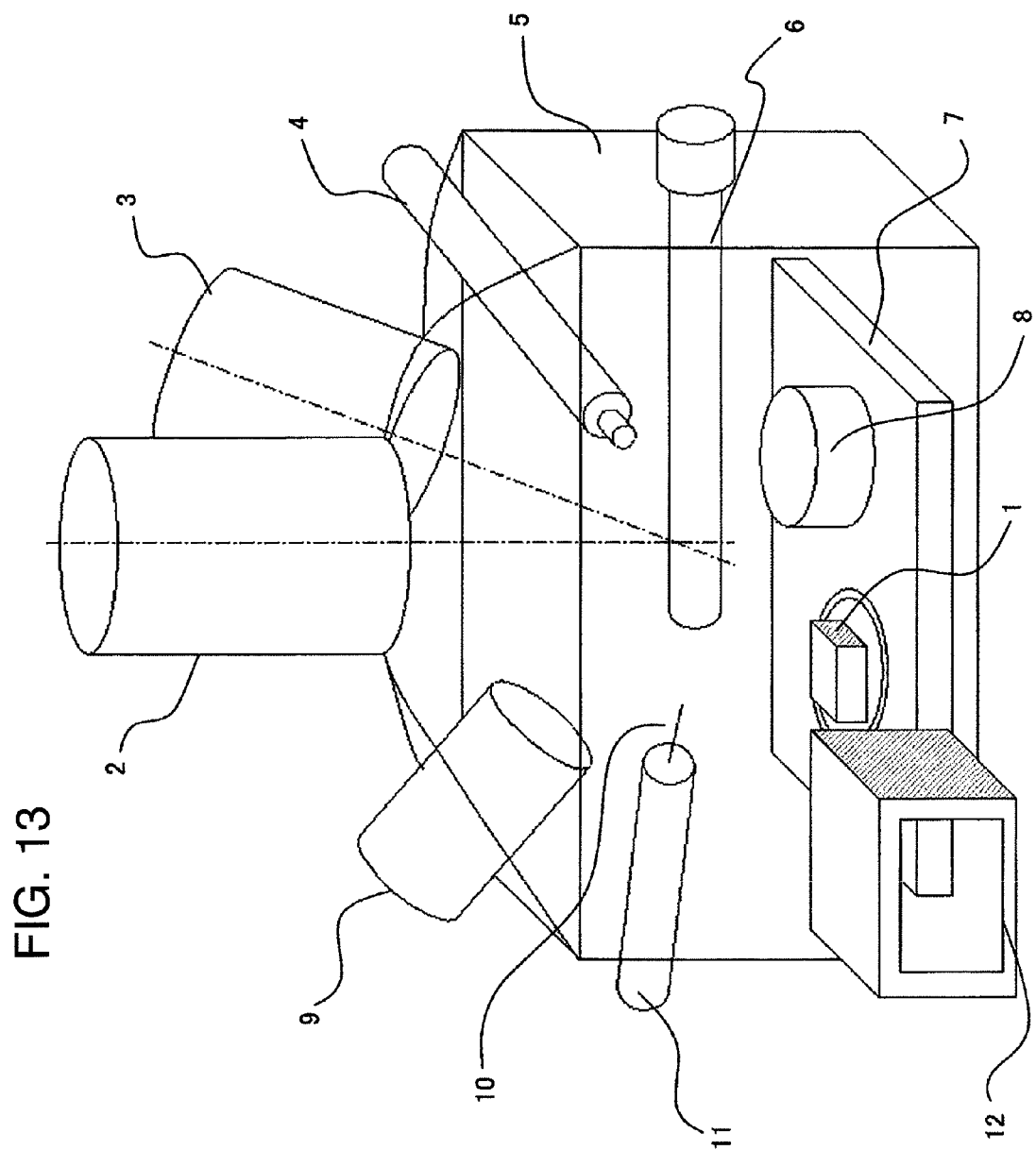
FIG. 13 is a perspective view showing the internal structure of an FIB-STEM device.

FIG. 13 is a perspective view showing the internal structure of an FIB-STEM device. Embodiment 2 is similar in the fundamental structure to Embodiment 1; the sample 1 can be mounted on the second sample stage 7 in addition to the second detector 8.

Figure 14:
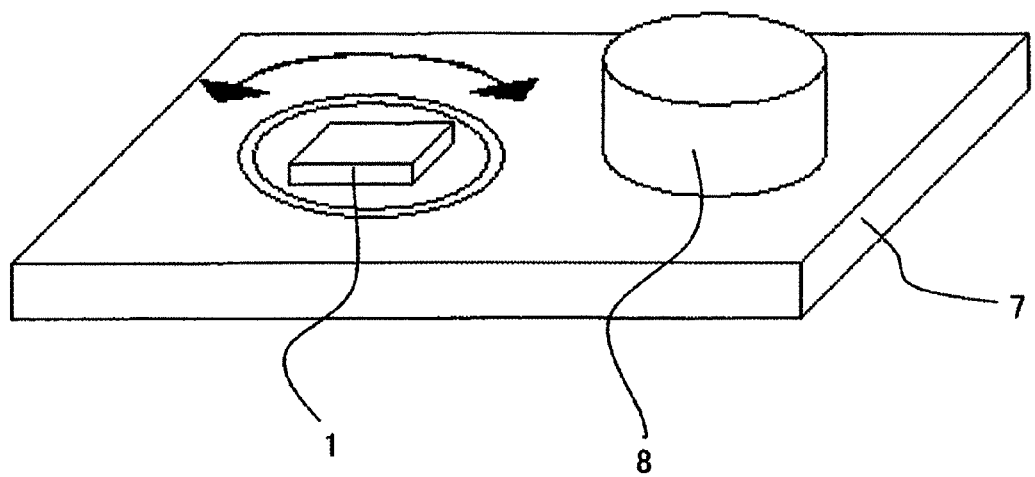
FIG. 14 is an enlarged perspective view of a second sample stage.

FIG. 14 is an enlarged perspective view of the second sample stage 7 and the sample 1 is mounted on a rotary stage that turns independently.

Figure 22:
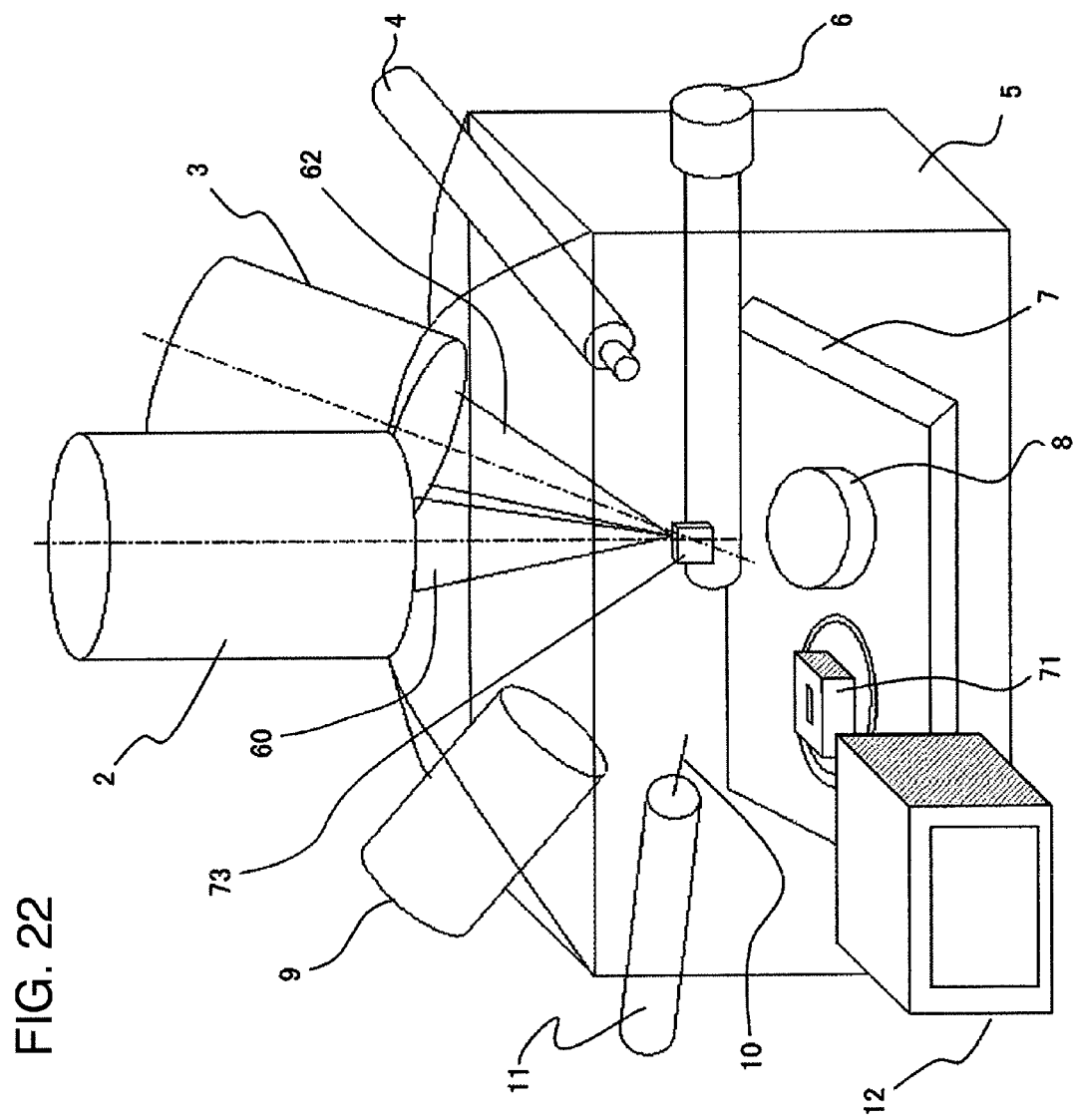
FIG. 22 is a perspective view showing the internal structure of the FIB-STEM device.
Figure 23:
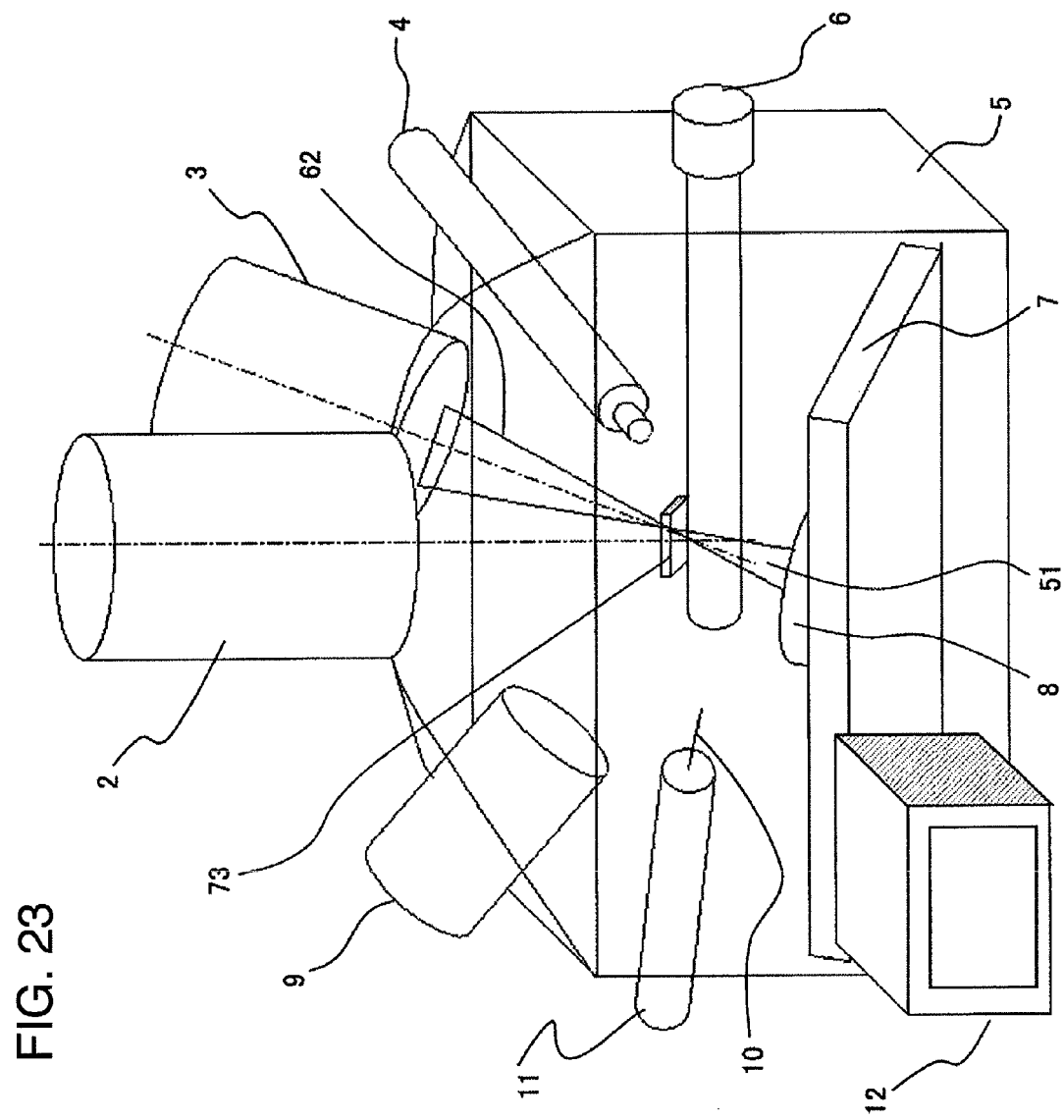
FIG. 23 is a perspective view showing the internal structure of the FIB-STEM device.
Figure 24:
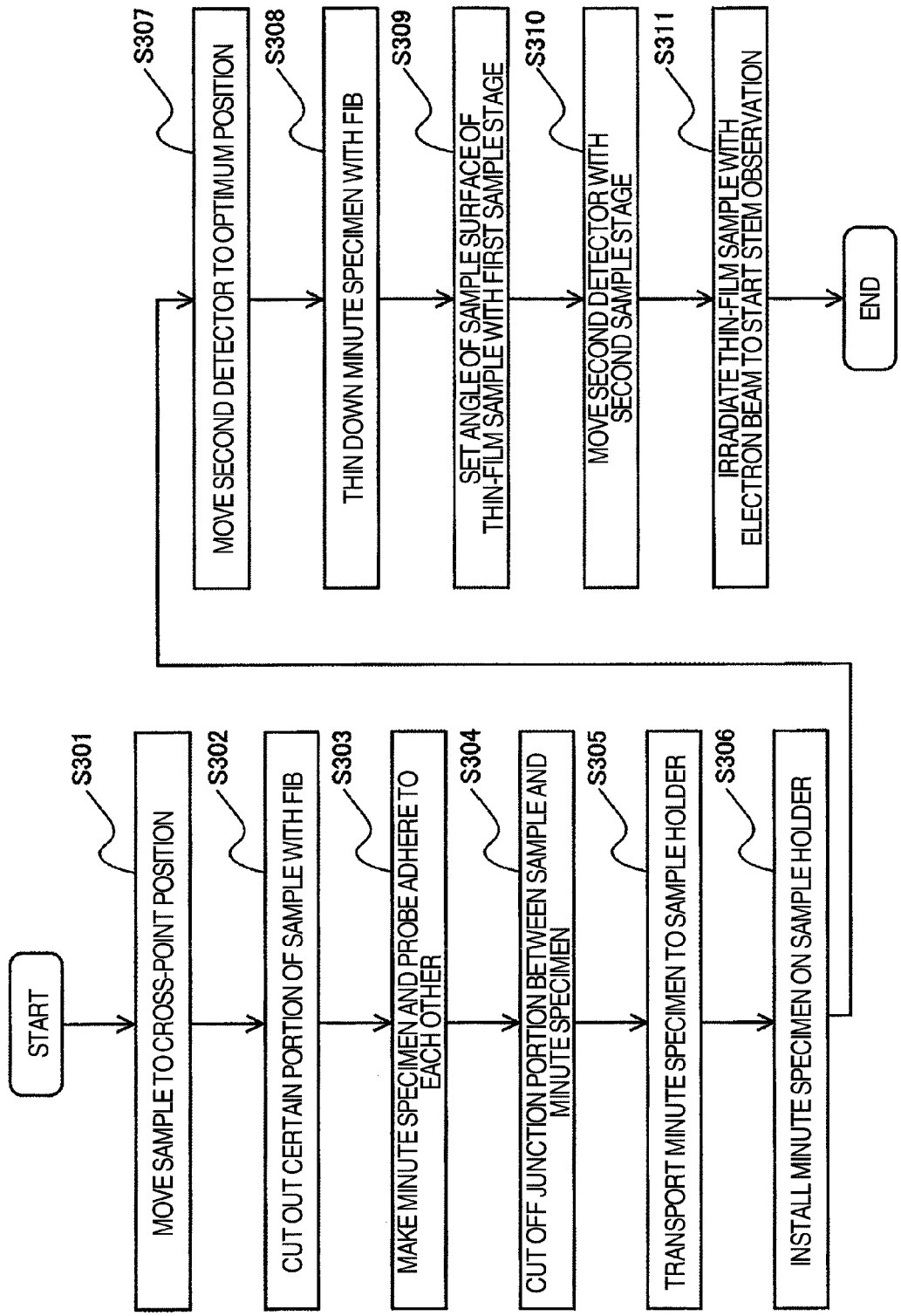
FIG. 24 is a flowchart describing a sequence of operations until a thin-film sample to which a bulk sample is thinned down is observed with an STEM.

FIGS. 15-23 are perspective views showing the internal structure of the FIB-STEM device. Furthermore, FIG. 24 is a flowchart describing a sequence of operations until a thin-film sample 73 to which a bulk sample 71 is thinned down is observed with an STEM.

Figure 15:
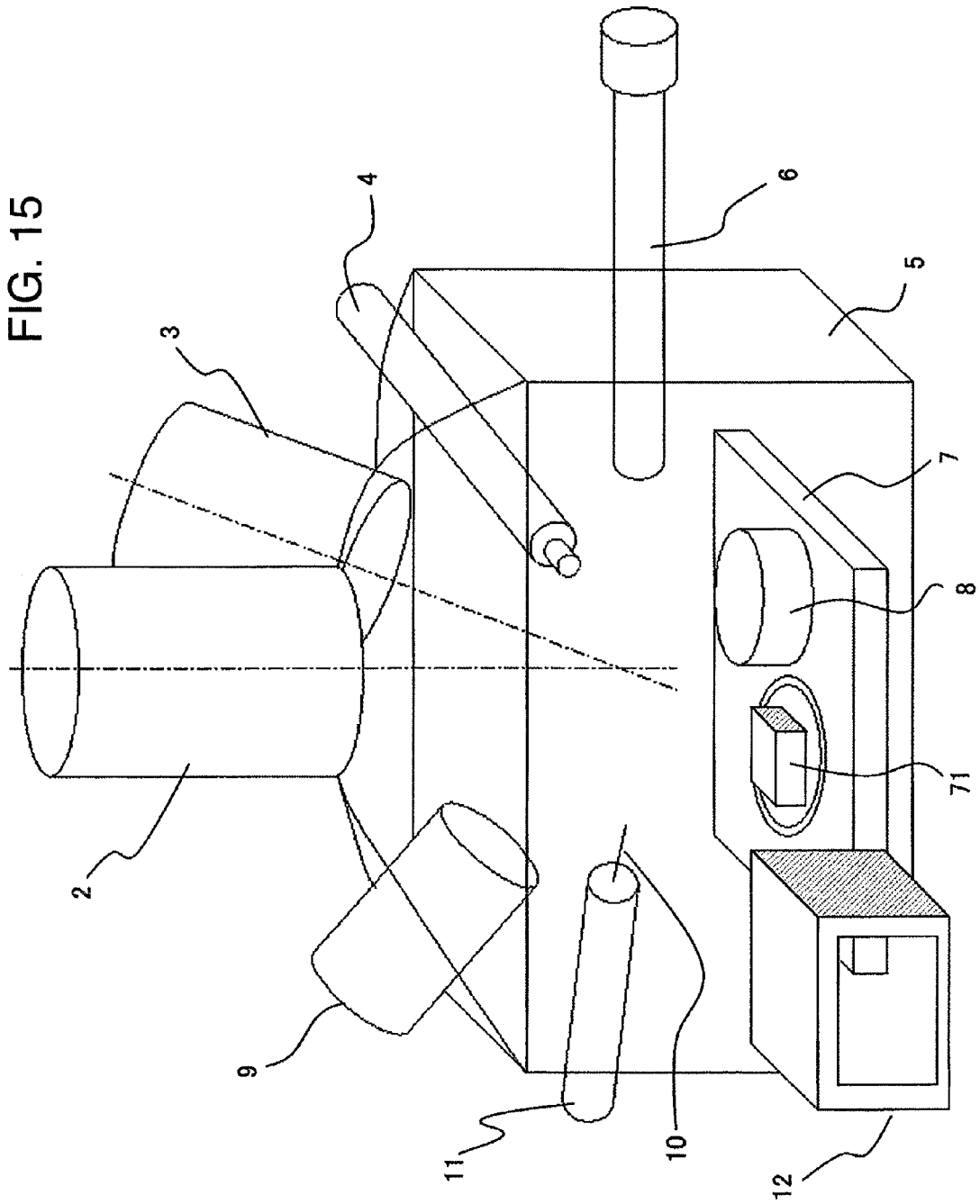
FIG. 15 is a perspective view showing the internal structure of the FIB-STEM device.
Figure 16:
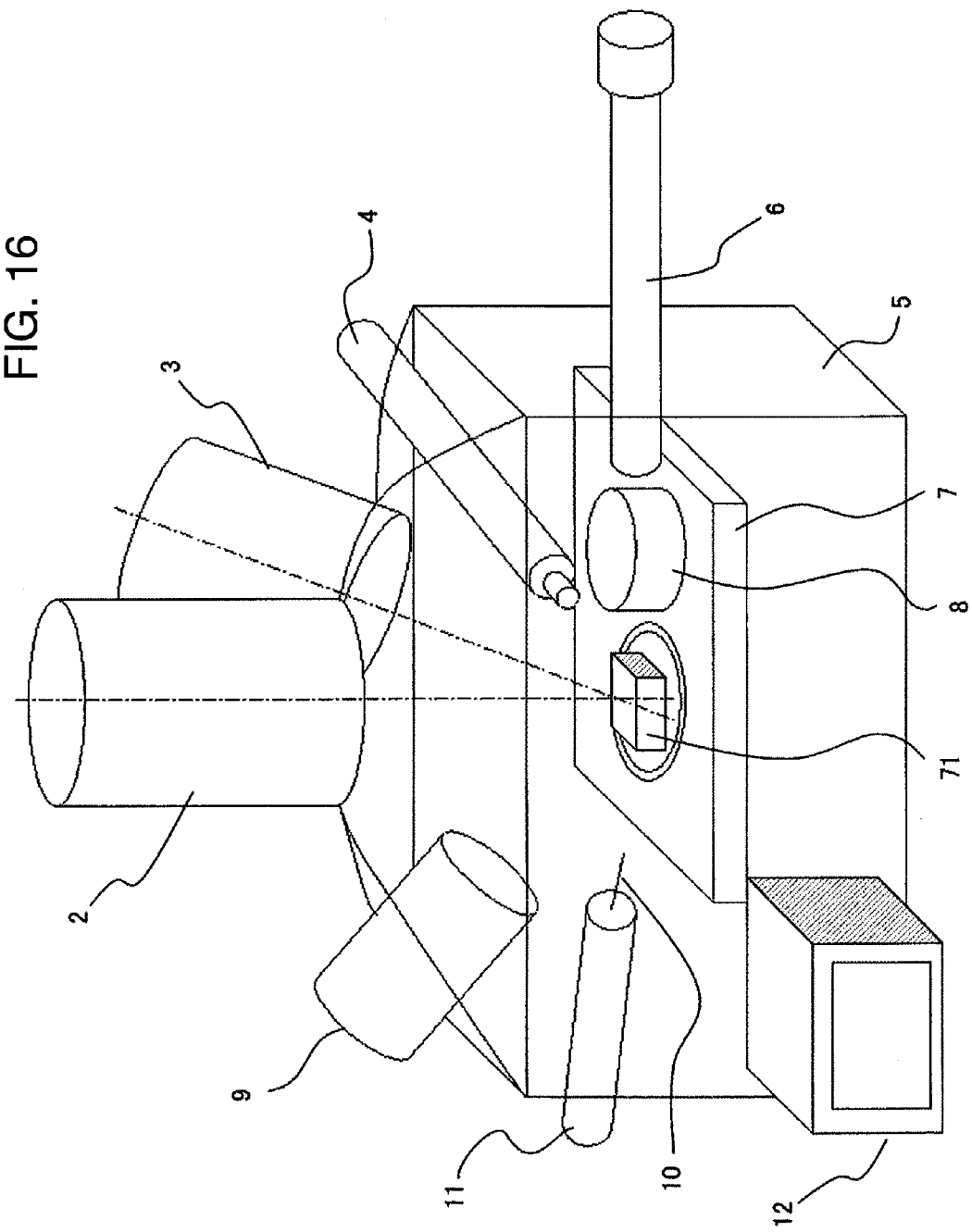
FIG. 16 is a perspective view showing the internal structure of the FIB-STEM device.
Figure 17:
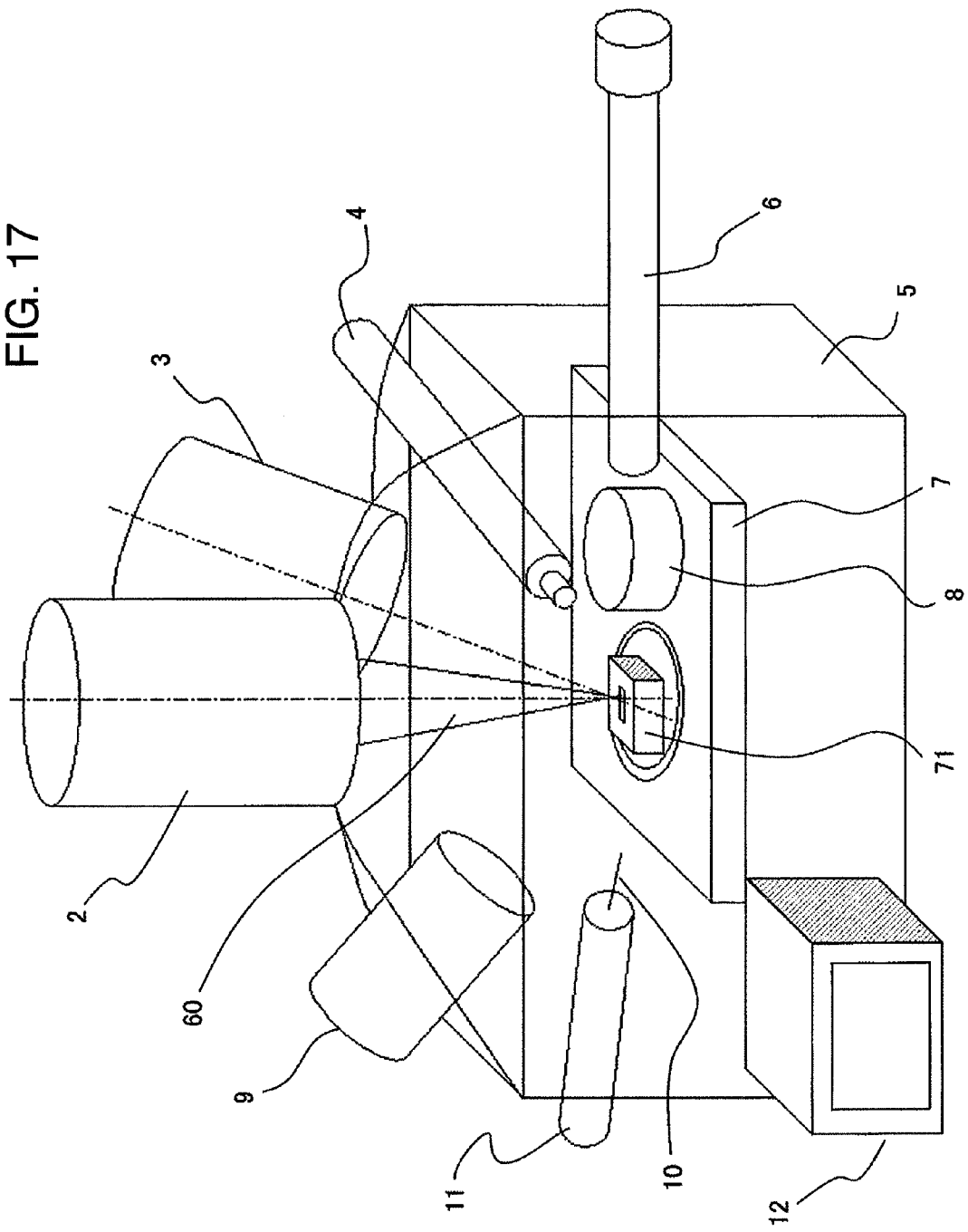
FIG. 17 is a perspective view showing the internal structure of the FIB-STEM device.
Figure 18:
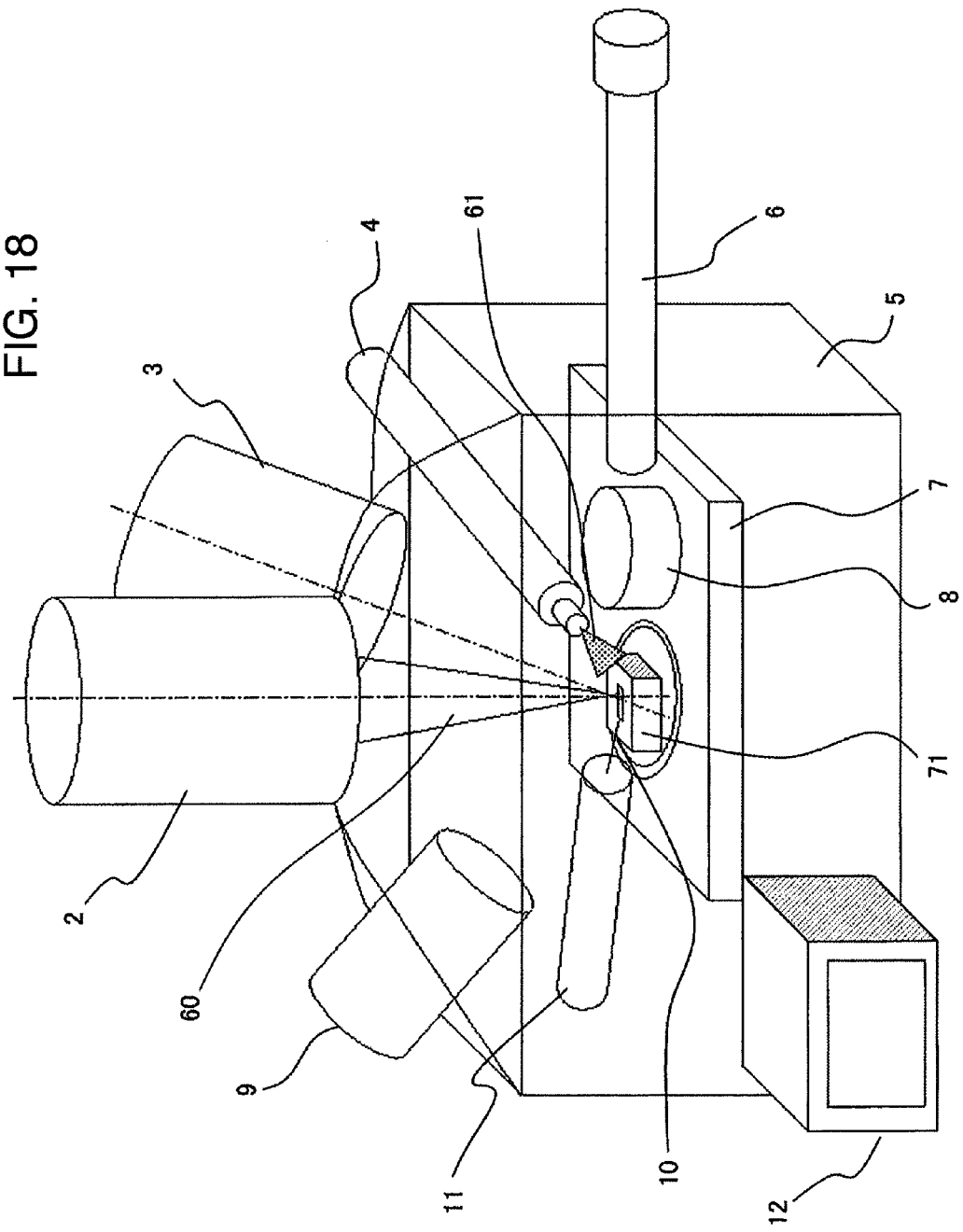
FIG. 18 is a perspective view showing the internal structure of the FIB-STEM device.
Figure 19:
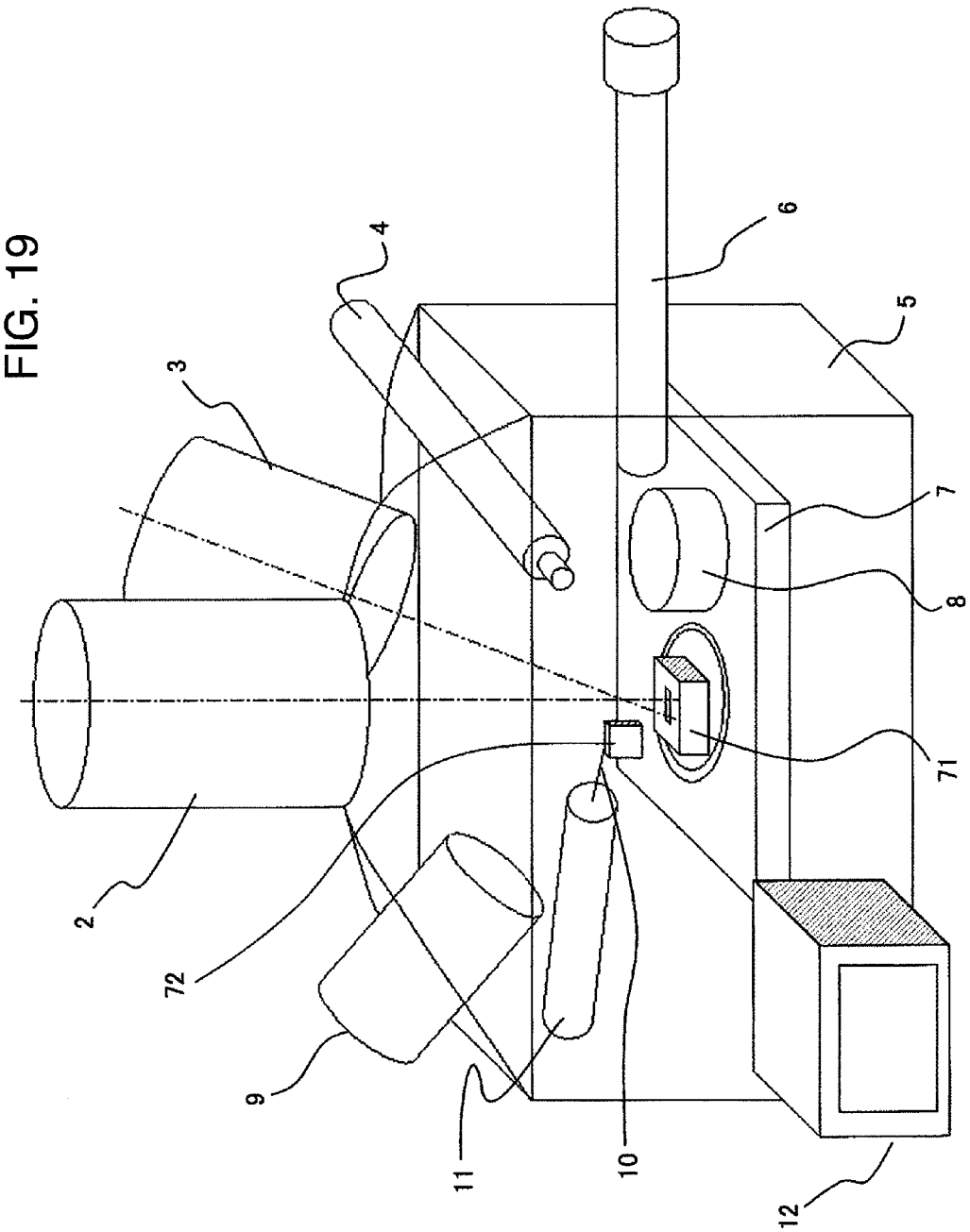
FIG. 19 is a perspective view showing the internal structure of the FIB-STEM device.
Figure 20:
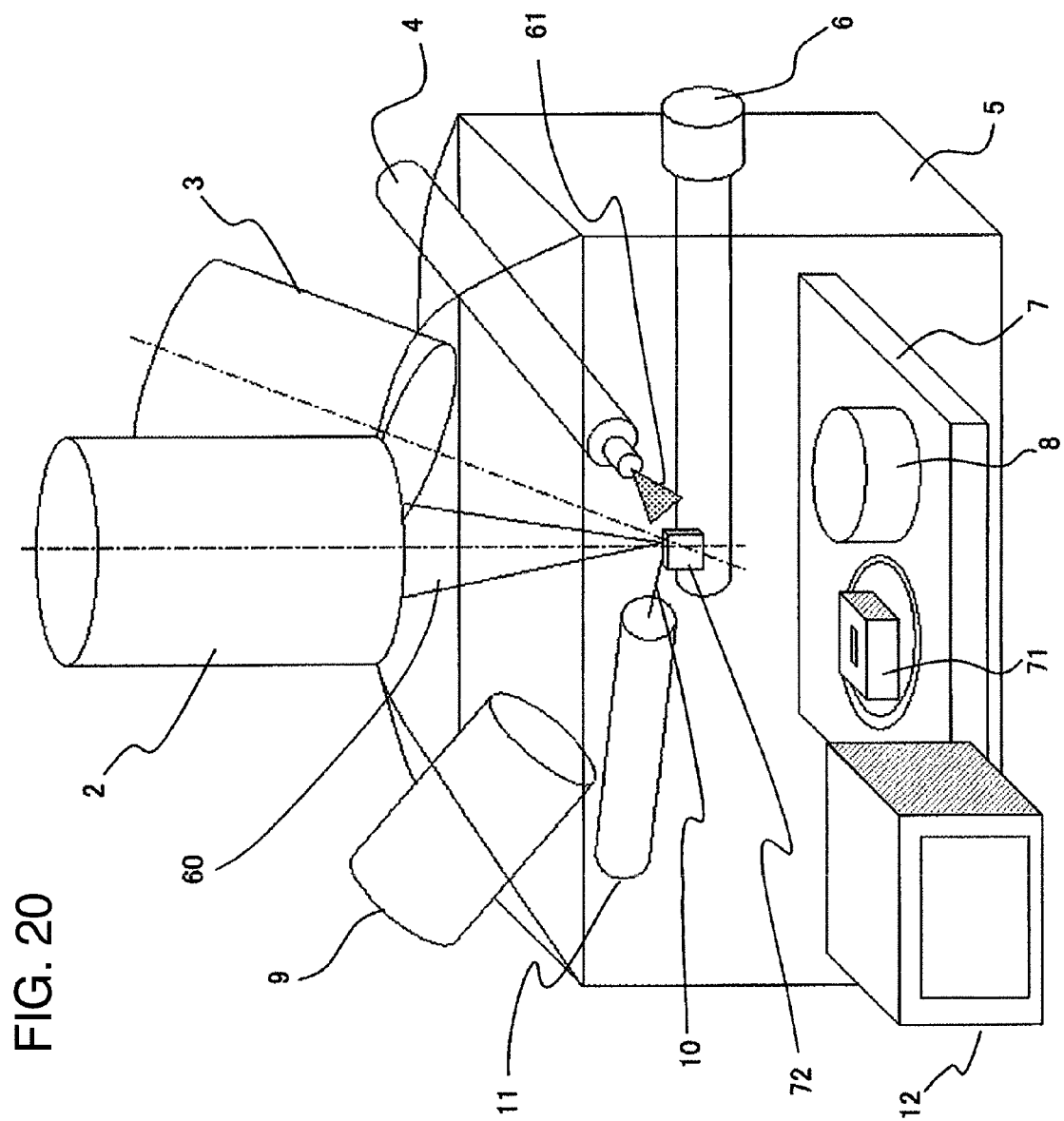
FIG. 20 is a perspective view showing the internal structure of the FIB-STEM device.
Figure 21:
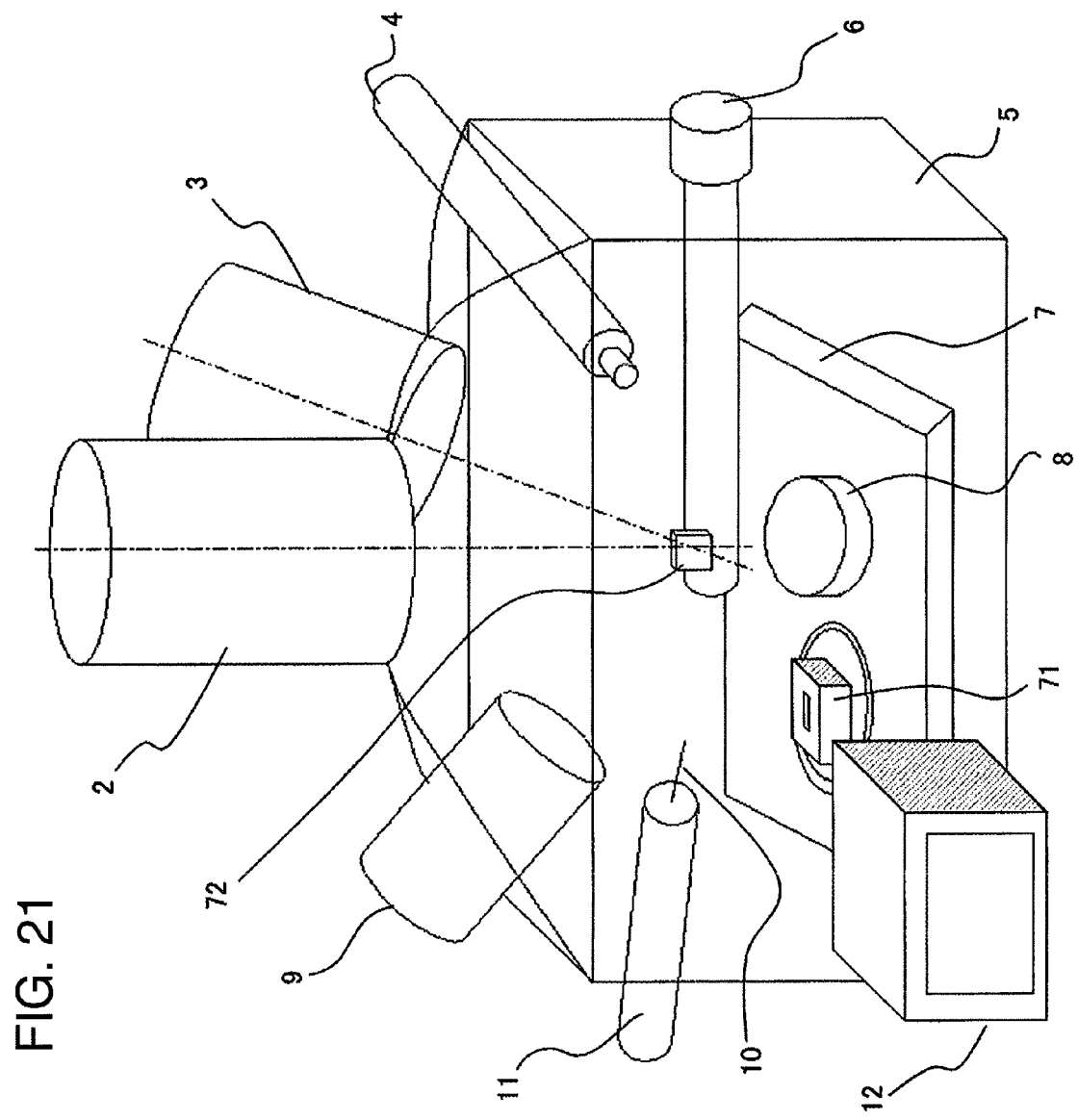
FIG. 21 is a perspective view showing the internal structure of the FIB-STEM device.

First, in FIG. 15, the bulk sample 71 and the second detector 8 are mounted on the second sample stage 7 within the device using the transport mechanism 12. Then, as shown in FIG. 16, the second sample stage 7 is moved in such a way that the bulk sample 71 is brought into the position of the cross point of the optical axis of the ion beam optics system 2 and the optical axis of the electron beam optics system 3 (S301). Next, the bulk sample 71 is cut out with an ion beam 60 emitted from the ion beam optics system 2 as shown in FIG. 17 (S302), and a minute specimen 72 in the bulk sample 71 and the probe 10 are made to adhere to each other using the ion beam 60 and a deposition gas 61 as shown in FIG. 18 (S303). Then, as shown in FIG. 19, the junction portion between the bulk sample 71 and the minute specimen 72 is cut off (S304), and the minute specimen 72 is taken out of the bulk sample 71 and transported to the sample holder of the first sample stage 6 using the probe 10 and the probe driving mechanism 11 (S305). Next, as shown in FIG. 20, the second sample stage 7 is retracted, the sample holder of the first sample stage 6 is moved to the cross point of the two optical axes, and the minute specimen 72 is mounted onto an area of the sample holder of the first sample stage 6 where a sample is directly mounted or onto a mesh on a mesh area using the ion beam 60, the deposition gas 61, and the probe 10 (S306). Then, as shown in FIG. 21, the second detector 8 is moved into a position where a situation of thinning down of the minute specimen 72 can be observed with the SEM in order to carry out an end-point detection with the accuracy of the FIB machining when the minute specimen 72 is thinned down into a thin film with the ion beam (S307). Next, as shown in FIG. 22, the minute specimen 72 on the first sample stage 6 is thinned down using the ion beam 60 (S308). Then, as shown in FIG. 23, in order to perform STEM observation of the thin-film sample 73, which has been thinned down, the position of the first sample stage 6 is so adjusted that the observed surface of the thin-film sample 73 faces the electron beam optics system 3 (S309), and the second sample stage 7 is so adjusted that the second detector 8 is on the optical axis of the electron beam optics system 3 and faces the electron beam optics system 3 (S310). Then, the electron beam 62 emitted from the electron beam optics system 3 is made to impinge on the thin-film sample 73 and scanned, and generated transmitted electrons 65 are detected by the second detector 8 (S311).

In the above-described Embodiment 2, the minute specimen 72 and the probe 10 are made to adhere to each other, and the sample 1 and the minute specimen 72 are separated at the end using the ion beam. The probe 10 may be made to adhere to the minute specimen 72 after a specific portion of the sample 1 is cut out so that the minute specimen 72 cut out from the sample 1 is completely separated.

Furthermore, in Embodiment 2, it is not necessary to take in and out the sample and the second detector from the preparation of the sample until the STEM observation and, therefore, a time period until observation can be reduced. Furthermore, since no stage dedicated for the detector is needed, there is an advantage that the sample chamber can be made small in size. Because of reduction in size of the sample chamber, the time to evacuate the inside of the sample chamber can be reduced and the time from startup of the device to observation can also be reduced. Additionally, because no stage dedicated for the detector is needed, the manufacturing cost can be reduced. Also, since attaching/detaching of the second detector to the second sample stage is easy, periodic maintenance of the second detector is easy; further, because movement of the second detector can be accomplished by moving the second sample stage, no extra moving mechanism for the second detector is required, and the number of parts to be replaced is reduced, leading to an improvement of the maintainability.

While embodiments of the present invention have been described concretely so far, the invention is not limited to the above embodiments; those skilled in the art would easily appreciate that various changes and modifications are possible within the scope of the invention set forth in the claims.

REFERENCE SIGNS LIST

1: sample
2: ion beam optics system
3: electron beam optics system
4: deposition gas source
5: sample chamber
6: first sample stage
7: second sample stage
8: second detector
9: first detector
10: probe
11: probe driving mechanism
12: transport mechanism
13: transport arm
20, 21: connectors
22: sensor
30, 62: electron beams
31, 41: principal axes
40, 60: ion beams
51, 65: transmitted electrons
52: bright-field transmitted electrons
53: dark-field transmitted electrons
54: bright-field detection portion
55: dark-field detection portion
61: deposition gas
71: bulk sample
72: minute specimen
73: thin-film sample

The invention claimed is:

1. A charged particle beam device comprising:
   an ion beam optics column which irradiates a sample with an ion beam;
   an electron beam optics column which irradiates the sample with an electron beam;
   a first sample stage on which the sample is mounted and which is capable of planar movement and tilt movement;
   a detector which detects a signal generated from the sample; and
   a second sample stage on which the detector can be mounted,
   wherein, when the detector is mounted on the second sample stage, the second sample stage is capable of rotating within a plane that includes an optical axis of the electron beam optics column and an optical axis of the ion beam optics column, and that has a cross point at which the optical axis of the electron beam optics column and the optical axis of the ion beam optics column intersect as a center,
   so that the detector can tilt with respect to the first sample stage and the cross point, and a distance between the detector and the first sample stage or the cross point can be varied.

2. The charged particle beam device according to claim 1, wherein the detector can be attached to and detached from the second sample stage.

3. The charged particle beam device according to claim 1, wherein the detector can acquire an image of transmitted electrons and an image of a secondary signal.

4. The charged particle beam device according to claim 1, wherein a distance between an observed surface of the sample and the cross point can be varied.

5. A sample observation method comprising the steps of:
   selecting an optics system used to observe an observed surface of a sample among a plurality of optics systems;
   setting an angle of the observed surface of the sample; and
   setting a position of a detector, which can be mounted on a second sample stage, to detect a secondary signal generated from the sample, at a prescribed position among positions which are accessible by tilting the detector with respect to a first sample stage on which the sample is mounted, and a cross point where optical axes of the plurality of optics systems intersect, by rotating the second sample stage within a plane that includes the optical axes of the plurality of optics systems and that has the cross point as a center.

6. The sample observation method according to claim 5, wherein, in the step of selecting an optical system, any one of an ion beam optics system and an electron beam optics system is selected.

7. The sample observation method according to claim 5, wherein, in the step of setting an angle of the observed surface of the sample, the observed surface of the sample can be tilted to a direction facing the electron beam optics system, a direction facing the ion beam optics system, and a direction parallel to an optical axis of the ion beam optics system.

8. The sample observation method according to claim 5, wherein, in the step of setting a position of a detector, the detector can move to any one of a position where an optical axis of the electron beam optics system and a principal axis of the detector are in line symmetry with respect to a line normal to the observed surface of the sample, a position where an optical axis of the ion beam optics system and the principal axis of the detector are in line symmetry, and a position which lies on the optical axis of the electron beam optics system and across which an electron beam transmitted through the sample passes.

9. A charged particle beam device comprising:
an electron beam optics column which generates an electron beam for observing an observed surface of a sample;
an ion beam optics column which generates an ion beam to machine the sample;
a first sample stage on which a minute specimen cut out of the sample by machining using the ion beam is mounted; and
a second sample stage on which the sample before the minute specimen being cut out and a detector detecting transmitted electrons from the sample are mounted and which is capable of horizontal movement, vertical movement, and tilt movement,
wherein the second sample stage is capable of moving to tilt the detector with respect to the first sample stage and a cross point at which an optical axis of the electron beam optics column and an optical axis of the ion beam optics column intersect by rotating within a plane that includes the optical axis of the electron beam optics column and the optical axis of the ion beam optics column, and that has the cross point as a center, and to vary a distance between the detector and the first sample stage or the cross point.

* * * * *